United States Patent
Goto et al.

(10) Patent No.: US 11,990,569 B2
(45) Date of Patent: May 21, 2024

(54) LED LIGHTING SHEET FOR ANIMAL/PLANT GROWTH, LED LIGHTING MODULE FOR ANIMAL/PLANT GROWTH, SHELF FOR ANIMAL/PLANT GROWTH RACK, ANIMAL/PLANT GROWTH RACK, ANIMAL/PLANT GROWTH FACTORY, AND LED LIGHTING UNIT FOR ANIMAL/PLANT GROWTH

(71) Applicant: DAI NIPPON PRINTING CO., LTD., Tokyo-to (JP)

(72) Inventors: Daisuke Goto, Tokyo-to (JP); Naoto Kamekawa, Tokyo-to (JP); Dai Tsukada, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/383,947

(22) Filed: Jul. 23, 2021

(65) Prior Publication Data

US 2021/0351328 A1    Nov. 11, 2021

Related U.S. Application Data

(63) Continuation of application No. PCT/JP2020/002408, filed on Jan. 23, 2020.

(30) Foreign Application Priority Data

Jan. 24, 2019  (JP) ................................. 2019-010403
Jan. 24, 2019  (JP) ................................. 2019-010664

(Continued)

(51) Int. Cl.
  *H01L 33/48*  (2010.01)
  *A01G 7/04*   (2006.01)
  (Continued)

(52) U.S. Cl.
  CPC ............ *H01L 33/486* (2013.01); *A01G 7/045* (2013.01); *F21V 23/008* (2013.01); *H01L 33/52* (2013.01); *H01L 33/62* (2013.01); *F21Y 2115/10* (2016.08)

(58) Field of Classification Search
  CPC ............................... A01G 7/045; A01G 9/249
  See application file for complete search history.

(56) References Cited

U.S. PATENT DOCUMENTS 5,012,609 A * 5/1991 Ignatius ................ A01G 7/045
                                                    47/1.01 R
8,071,988 B2 * 12/2011 Lee ..................... H01L 25/0753
                                                         257/89
(Continued)

FOREIGN PATENT DOCUMENTS

JP   2006-120644 A   5/2006
JP   2008-118957 A   5/2008
(Continued)

OTHER PUBLICATIONS

Mar. 31, 2020 International Search Report issued in International Patent Application No. PCT/JP2020/002408.
(Continued)

*Primary Examiner* — Andrew J Coughlin
(74) *Attorney, Agent, or Firm* — Oliff PLC

(57) ABSTRACT

An LED lighting sheet (20) for animal/plant growth includes an array of LED chips (21) and has a total luminous flux of 3000 lm or more.

14 Claims, 16 Drawing Sheets

(30) Foreign Application Priority Data

Feb. 1, 2019 (JP) ................................. 2019-017444
Feb. 5, 2019 (JP) ................................. 2019-019043

(51) Int. Cl.
*F21V 23/00* (2015.01)
*H01L 33/52* (2010.01)
*H01L 33/62* (2010.01)
*F21Y 115/10* (2016.01)

(56) References Cited

U.S. PATENT DOCUMENTS

| | | | |
|---|---|---|---|
| 10,043,953 B2* | 8/2018 | Kim | H01L 33/505 |
| 10,434,280 B2* | 10/2019 | Peeters | H05B 45/22 |
| 10,477,636 B1* | 11/2019 | Petluri | H05B 45/44 |
| 10,557,595 B2* | 2/2020 | David | F21V 23/02 |
| 2002/0070681 A1* | 6/2002 | Shimizu | H01L 25/0753 |
| | | | 315/246 |
| 2003/0063462 A1* | 4/2003 | Shimizu | F21K 9/233 |
| | | | 362/230 |
| 2005/0184638 A1* | 8/2005 | Mueller | C09K 11/7731 |
| | | | 313/485 |
| 2007/0159091 A1* | 7/2007 | Hirosaki | C09K 11/0883 |
| | | | 313/503 |
| 2008/0231214 A1* | 9/2008 | Kim | H05B 45/00 |
| | | | 257/89 |
| 2009/0303694 A1* | 12/2009 | Roth | C09K 11/7735 |
| | | | 257/E33.061 |
| 2010/0237766 A1* | 9/2010 | Baumgartner | F21V 9/32 |
| | | | 445/3 |
| 2012/0113650 A1* | 5/2012 | Inoue | C03C 4/16 |
| | | | 501/18 |
| 2013/0044474 A1* | 2/2013 | Aikala | F21V 15/01 |
| | | | 977/773 |
| 2018/0092308 A1 | 4/2018 | Barber, III et al. | |
| 2018/0153018 A1* | 5/2018 | Matsubayashi | F21S 8/04 |
| 2018/0343720 A1* | 11/2018 | Qiang | F21V 23/04 |

FOREIGN PATENT DOCUMENTS

| | | | |
|---|---|---|---|
| JP | 4147353 B2 | 9/2008 | |
| JP | 2010-182796 A | 8/2010 | |
| JP | 2011-14357 A | 1/2011 | |
| JP | 2011-155948 A | 8/2011 | |
| JP | 2012-044043 A | 3/2012 | |
| JP | 4971623 B2 | 7/2012 | |
| JP | 5040863 B2 | 10/2012 | |
| JP | 2012-239417 A | 12/2012 | |
| JP | 3180774 U | 1/2013 | |
| JP | 2013-153691 A | 8/2013 | |
| JP | 2013-157441 A | 8/2013 | |
| JP | 2013-251230 A | 12/2013 | |
| JP | 5448043 B2 | 3/2014 | |
| JP | 5503760 B1 | 5/2014 | |
| JP | 2016-006832 A | 1/2016 | |
| JP | 5854778 B2 | 2/2016 | |
| JP | 2016-72189 A | 5/2016 | |
| JP | 2016-72524 A | 5/2016 | |
| JP | 2016-202072 A | 12/2016 | |
| JP | 2016-202108 A | 12/2016 | |
| JP | 2017-091718 A | 5/2017 | |
| JP | 6197485 B2 | 9/2017 | |
| JP | 2018-019667 A | 2/2018 | |
| JP | 2018-33356 A | 3/2018 | |
| JP | 2018-067573 A | 4/2018 | |
| JP | 2018-92821 A | 6/2018 | |
| JP | 2018-170389 A | 11/2018 | |
| JP | 2020-115788 A | 8/2020 | |
| JP | 2020-126786 A | 8/2020 | |

OTHER PUBLICATIONS

Jul. 27, 2021 International Preliminary Report on Patentability issued in International Patent Application No. PCT/JP2020/002408.
Jul. 10, 2020 Office Action issued in Japanese Patent Application No. 2019-010403.
Aug. 25, 2020 Office Action issued in Japanese Patent Application No. 2019-010403.
Mar. 15, 2021 Office Action issued in Japanese Patent Application No. 2019-010403.
Jul. 10, 2020 Office Action issued in Japanese Patent Application No. 2019-017444.
Aug. 25, 2020 Office Action issued in Japanese Patent Application No. 2019-017444.
Mar. 15, 2021 Office Action issued in Japanese Patent Application No. 2019-017444.
Feb. 19, 2021 Office Action issued in Japanese Patent Application No. 2020-174214.
Apr. 9, 2021 Office Action issued in Japanese Patent Application No. 2020-174214.
Jul. 31, 2020 Office Action issued in Japanese Patent Application No. 2019-010664.
Sep. 15, 2020 Office Action issued in Japanese Patent Application No. 2019-010664.
Nov. 6, 2020 Office Action issued in Japanese Patent Application No. 2019-010664.
Mar. 31, 2021 Office Action issued in Japanese Patent Application No. 2019-010664.
Jul. 31, 2020 Office Action issued in Japanese Patent Application No. 2019-019043.
"Launched Thin and Light Sheet-Type Surface Emitting LED Lighting for Plant Factories". <URL: https://www.dnp.co.jp/news/detail/1190662_1587_html>.
Sep. 27, 2022 Office Action issued in European Patent Application No. 20744533.9.
Jan. 6, 2023 Office Action issued in Japanese Patent Application No. 2020-194528.

* cited by examiner

LED LIGHTING SHEET FOR ANIMAL/PLANT GROWTH, LED LIGHTING MODULE FOR ANIMAL/PLANT GROWTH, SHELF FOR ANIMAL/PLANT GROWTH RACK, ANIMAL/PLANT GROWTH RACK, ANIMAL/PLANT GROWTH FACTORY, AND LED LIGHTING UNIT FOR ANIMAL/PLANT GROWTH

TECHNICAL FIELD

The present disclosure relates to an LED lighting sheet for animal/plant growth, an LED lighting module for animal/plant growth, a shelf for an animal/plant growth rack, an animal/plant growth rack, an animal/plant growth factory, and an LED lighting unit for animal/plant growth.

BACKGROUND ART

In recent years, there are growing demands for lighting units that use low-power consumption LEDs as light sources in place of existing fluorescent lights, high-pressure sodium lights, and the like as lighting units to be used in animal/plant growth factories.

A plant growth apparatus in which a plurality of straight-tube plant growth lights using LEDs as light sources is arranged in shelves for plant growth racks is known as an example of animal/plant growth factories that use lighting units using LEDs as light sources (see, for example, PTL 1).

An LED lighting unit for animal/plant growth, in which a plurality of LED chips is arranged on a flexible circuit board to form a surface light source, is also suggested (see, for example, PTL 2).

CITATION LIST

Patent Literature

PTL 1: Japanese Unexamined Patent Application Publication No. 2008-118957
PTL 2: Japanese Unexamined Patent Application Publication No. 2013-251230

The present disclosure provides an LED lighting sheet for animal/plant growth, an LED lighting module for animal/plant growth, a shelf for an animal/plant growth rack, an animal/plant growth rack, an animal/plant growth factory, and an LED lighting unit for animal/plant growth, which are capable of obtaining animals and/or plants with a high yield.

The present disclosure also provides an LED lighting module for animal/plant growth, an animal/plant growth rack, and an animal/plant growth factory, which are capable of obtaining animals and/or plants with a high yield by increasing an accumulated amount of light per unit time from an LED lighting sheet for animal/plant growth.

The present disclosure further provides an LED lighting sheet for animal/plant growth, an LED lighting module for animal/plant growth, a shelf for an animal/plant growth rack, an animal/plant growth rack, and an animal/plant growth factory, which are capable of protecting LED chips.

SUMMARY OF INVENTION

An LED lighting sheet for animal/plant growth according to an embodiment includes an array of LED chips, and a total luminous flux is 3000 lm or more.

In the LED lighting sheet for animal/plant growth according to the embodiment, the LED chips may have a luminous efficiency of 150 lm/W or higher.

In the LED lighting sheet for animal/plant growth according to the embodiment, ten or more of the LED chips may be arranged in series, and four or more rows of the LED chips arranged in series may be arranged in parallel.

In the LED lighting sheet for animal/plant growth according to the embodiment, the LED chips may be covered with a transparent protective film.

The LED lighting sheet for animal/plant growth according to the embodiment may further include a substrate film, and a metal wiring portion formed on a surface of the substrate film, and the plurality of LED chips may be implemented on the metal wiring portion.

In the LED lighting sheet for animal/plant growth according to the embodiment, a thickness of a thickest part may be less than or equal to 5 mm.

In the LED lighting sheet for animal/plant growth according to the embodiment, the total luminous flux may be 3900 lm or more.

An LED lighting module for animal/plant growth according to the embodiment includes the LED lighting sheet for animal/plant growth according to the embodiment, and a controller electrically connected to the LED lighting sheet for animal/plant growth, and the controller is externally connected to the LED lighting sheet for animal/plant growth.

In the LED lighting module for animal/plant growth according to the embodiment, a constant voltage may be applied from the controller to the LED lighting sheet for animal/plant growth.

In the LED lighting module for animal/plant growth according to the embodiment, the controller may be capable of controlling lighting of the LED chips.

A shelf for an animal/plant growth rack according to the embodiment includes a board, and the LED lighting sheet for animal/plant growth according to the embodiment or the LED lighting module for animal/plant growth according to the embodiment, attached to the board.

An animal/plant growth rack according to the embodiment includes a shelf, and the shelf includes the LED lighting sheet for animal/plant growth according to the embodiment or the LED lighting module for animal/plant growth according to the embodiment, attached to a lower side of a board.

In the animal/plant growth rack according to the embodiment, the LED lighting sheet for animal/plant growth may be further placed to a side of the shelf.

An animal/plant growth factory according to the embodiment includes a building, and the animal/plant growth rack according to the embodiment, placed in the building.

An LED lighting module for animal/plant growth according to the embodiment includes the LED lighting sheet for animal/plant growth, including an array of LED chips, and a controller electrically connected to the LED lighting sheet for animal/plant growth. A constant voltage is applied from the controller to the LED lighting sheet for animal/plant growth.

In the LED lighting module for animal/plant growth according to the embodiment, the controller may be capable of controlling lighting of the LED chips.

In the LED lighting module for animal/plant growth according to the embodiment, the controller may be externally connected to the LED lighting sheet for animal/plant growth.

In the LED lighting module for animal/plant growth according to the embodiment, the controller may be detachably connected to the LED lighting sheet for animal/plant growth via a connector.

In the LED lighting module for animal/plant growth according to the embodiment, the LED lighting sheet for animal/plant growth may include a power supply line used to supply a current to another LED lighting sheet for animal/plant growth.

In the LED lighting module for animal/plant growth according to the embodiment, a plurality of the LED chips may be arranged in series, and a plurality of rows of the LED chips arranged in series may be arranged in parallel, the LED lighting sheet for animal/plant growth may include regulators respectively in correspondence with the rows of the LED chips, and each of the regulators may maintain a constant current flowing through the plurality of LED chips of an associated one of the rows.

In the LED lighting module for animal/plant growth according to the embodiment, ten or more of the LED chips may be arranged in series, and four or more rows of the LED chips arranged in series may be arranged in parallel.

In the LED lighting module for animal/plant growth according to the embodiment, the LED chips may be covered with a transparent protective film.

An animal/plant growth rack according to the embodiment includes a shelf, and the shelf includes the LED lighting module for animal/plant growth according to the embodiment, attached to a lower side of a board.

An animal/plant growth factory according to the embodiment includes a building, and the animal/plant growth rack according to the embodiment, placed in the building.

An LED lighting unit for animal/plant growth according to the embodiment includes an array of LED chips, and a light source color of each of the LED chips is an incandescent or a warm white, of light source colors defined in JISZ9112.

In the LED lighting unit for animal/plant growth according to the embodiment, the light source color of each of the LED chips may be the incandescent.

An LED lighting unit for animal/plant growth according to the embodiment includes an array of LED chips, an emission spectrum of light from the LED chips has a first peak with a center wavelength of greater than or equal to 610 nm and less than or equal to 630 nm, a second peak with a center wavelength of greater than or equal to 440 nm and less than or equal to 460 nm, and a third peak with a center wavelength of greater than or equal to 510 nm and less than or equal to 530 nm, a relative emission intensity in the first peak is higher than a relative emission intensity in the second peak, and a relative emission intensity in the third peak is lower than the relative emission intensity in the second peak.

An LED lighting unit for animal/plant growth according to the embodiment includes an array of LED chips, light from the LED chips has a first component with a center wavelength of greater than or equal to 610 nm and less than or equal to 630 nm and a half width of greater than or equal to 90 nm and less than or equal to 110 nm, a second component with a center wavelength of greater than or equal to 440 nm and less than or equal to 460 nm and a half width of greater than or equal to 10 nm and less than or equal to 20 nm, and a third component with a center wavelength of greater than or equal to 510 nm and less than or equal to 530 nm and a half width of greater than or equal to 50 nm and less than or equal to 60 nm, a relative emission intensity in the center wavelength of the first component is higher than a relative emission intensity in the center wavelength of the second component, and a relative emission intensity in the center wavelength of the third component is lower than the relative emission intensity in the center wavelength of the second component.

In the LED lighting unit for animal/plant growth according to the embodiment, the relative emission intensity in the center wavelength of the second component may be higher than or equal to 0.5 times and lower than or equal to 0.7 times the relative emission intensity in the center wavelength of the first component, and the relative emission intensity in the center wavelength of the third component may be higher than or equal to 0.3 times and lower than or equal to 0.5 times the relative emission intensity in the center wavelength of the first component.

An LED lighting unit for animal/plant growth according to the embodiment includes an array of LED chips, and a chromaticity of light from the LED chips falls within a rectangular region connecting four sets of chromaticity coordinates (0.39, 0.36), (0.41, 0.44), (0.46, 0.44), and (0.42, 0.36) in an xy chromaticity diagram.

In the LED lighting unit for animal/plant growth according to the embodiment, ten or more of the LED chips may be arranged in series, and four or more rows of the LED chips arranged in series may be arranged in parallel.

In the LED lighting unit for animal/plant growth according to the embodiment, the LED chips may be covered with a transparent protective film.

The LED lighting unit for animal/plant growth according to the embodiment may further include a substrate film, and a metal wiring portion formed on a surface of the substrate film, and the plurality of LED chips may be implemented on the metal wiring portion.

In the LED lighting unit for animal/plant growth according to the embodiment, a thickness of a thickest part may be less than or equal to 5 mm.

An LED lighting module for animal/plant growth according to the embodiment includes the LED lighting unit for animal/plant growth according to the embodiment, and a controller electrically connected to the LED lighting unit for animal/plant growth, and the controller is externally connected to the LED lighting unit for animal/plant growth.

In the LED lighting module for animal/plant growth according to the embodiment, a constant voltage may be applied from the controller to the LED lighting unit for animal/plant growth.

In the LED lighting module for animal/plant growth according to the embodiment, the controller may be capable of controlling lighting of the LED chips.

A shelf for an animal/plant growth rack according to the embodiment includes a board, and the LED lighting unit for animal/plant growth according to the embodiment or the LED lighting module for animal/plant growth according to the embodiment, attached to the board.

An animal/plant growth rack according to the embodiment includes a shelf, and the shelf includes the LED lighting unit for animal/plant growth according to the embodiment or the LED lighting module for animal/plant growth according to the embodiment, attached to a lower side of a board.

In the animal/plant growth rack according to the embodiment, the LED lighting unit for animal/plant growth may be further placed to a side of the shelf.

An animal/plant growth factory according to the embodiment includes a building, and the animal/plant growth rack according to the embodiment, placed in the building.

An LED lighting sheet for animal/plant growth according to the embodiment includes a substrate film, a metal wiring portion formed on a surface of the substrate film, an LED chip implemented on the metal wiring portion, and a protective portion that at least partially covers a side of the LED chip and protects the LED chip.

In the LED lighting sheet for animal/plant growth according to the embodiment, the LED chip may be implemented on the metal wiring portion via a solder portion, the solder portion may extend from a back side of the LED chip to the side of the LED chip, and the protective portion may cover the solder portion located laterally to the LED chip.

In the LED lighting sheet for animal/plant growth according to the embodiment, the protective portion may include a center part that at least partially covers a surface of the LED chip, a curved part that at least partially covers the side of the LED chip, and a flat part formed contiguously to the curved part.

In the LED lighting sheet for animal/plant growth according to the embodiment, the center part may cover an entire region of the surface of the LED chip.

In the LED lighting sheet for animal/plant growth according to the embodiment, a thickness of the center part may gradually increase toward a center of the LED chip.

In the LED lighting sheet for animal/plant growth according to the embodiment, the curved part may cover an entire region of the side of the LED chip.

In the LED lighting sheet for animal/plant growth according to the embodiment, a thickness of the curved part may gradually increase with approach to the LED chip.

In the LED lighting sheet for animal/plant growth according to the embodiment, in a cross section perpendicular to a light emitting surface of the LED lighting sheet for animal/plant growth, the curved part may have a concave shape that is recessed from a light emitting surface side of the LED lighting sheet for animal/plant growth toward a side opposite from the light emitting surface.

In the LED lighting sheet for animal/plant growth according to the embodiment, the curved part may cover the solder portion located laterally to the LED chip.

In the LED lighting sheet for animal/plant growth according to the embodiment, in a cross section perpendicular to a light emitting surface of the LED lighting sheet for animal/plant growth, a part of the solder portion, located laterally to the LED chip, may have a curved shape bowed toward the light emitting surface.

In the LED lighting sheet for animal/plant growth according to the embodiment, in a cross section perpendicular to a light emitting surface of the LED lighting sheet for animal/plant growth, a part of the solder portion, of which a thickness is thickest, does not need to be in contact with the side of the LED chip.

In the LED lighting sheet for animal/plant growth according to embodiment, when viewed from a light emitting surface side of the LED lighting sheet for animal/plant growth, a part of the solder portion, located laterally to the LED chip, may be formed so as to partially surround the side of the LED chip.

The LED lighting sheet for animal/plant growth according to the embodiment may further include a light reflection insulating protective film placed so as to cover the metal wiring portion, and the protective portion may cover the light reflection insulating protective film.

In the LED lighting sheet for animal/plant growth according to the embodiment, the protective portion may cover an entire region of a surface and side of the LED chip.

In the LED lighting sheet for animal/plant growth according to the embodiment, the protective portion may have a transparent protective film.

In the LED lighting sheet for animal/plant growth according to the embodiment, a gap may be formed between the transparent protective film and a side of the LED chip.

In the LED lighting sheet for animal/plant growth according to the embodiment, the protective portion may further have a bonding layer that bonds the LED chip and the transparent protective film.

In the LED lighting sheet for animal/plant growth according to the embodiment, the protective portion may cover a side of the LED chip with the bonding layer.

In the LED lighting sheet for animal/plant growth according to the embodiment, ten or more of the LED chips may be arranged in series, and four or more rows of the LED chips arranged in series may be arranged in parallel.

In the LED lighting sheet for animal/plant growth according to the embodiment, a thickness of a thickest part may be less than or equal to 5 mm.

An LED lighting module for animal/plant growth according to the embodiment includes the LED lighting sheet for animal/plant growth according to the embodiment, and a controller electrically connected to the LED lighting sheet for animal/plant growth, and the controller is externally connected to the LED lighting sheet for animal/plant growth.

In the LED lighting module for animal/plant growth according to the embodiment, a constant voltage may be applied from the controller to the LED lighting sheet for animal/plant growth.

In the LED lighting module for animal/plant growth according to the embodiment, the controller may be capable of controlling lighting of the LED chips.

A shelf for an animal/plant growth rack according to the embodiment includes a board, and the LED lighting sheet for animal/plant growth according to the embodiment or the LED lighting module for animal/plant growth according to the embodiment, attached to the board.

An animal/plant growth rack according to the embodiment includes a shelf, and the shelf includes the LED lighting sheet for animal/plant growth according to the embodiment or the LED lighting module for animal/plant growth according to the embodiment, attached to a lower side of a board.

In the animal/plant growth rack according to the embodiment, the LED lighting sheet for animal/plant growth may be further placed to a side of the shelf.

An animal/plant growth factory according to the embodiment includes a building, and the animal/plant growth rack according to the embodiment, placed in the building.

According to the embodiment, animals and/or plants are obtained with a high yield.

According to the embodiment, animals and/or plants are obtained with a high yield by increasing an accumulated amount of light per unit time from the LED lighting sheet for animal/plant growth.

Furthermore, according to the embodiment, the LED chips are protected.

DESCRIPTION OF EMBODIMENTS

First Embodiment

Figure 1:
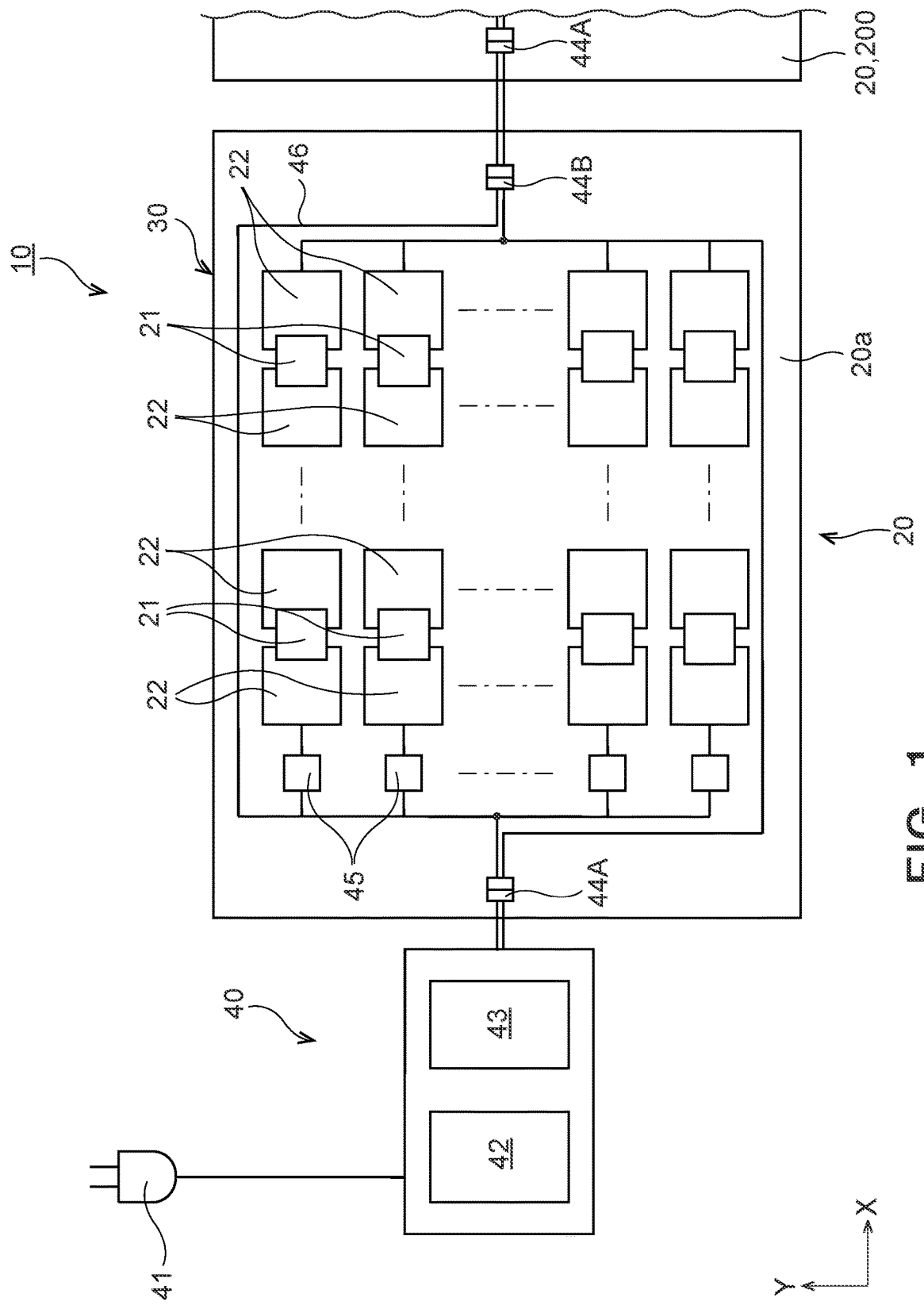
FIG. 1 is a schematic view showing an LED lighting module according to a first embodiment.

An LED lighting sheet for animal/plant growth according to a first embodiment includes an array of LED chips, and a total luminous flux (of the LED lighting sheet) is 3000 lm or more.

An LED lighting module for animal/plant growth according to the first embodiment includes an LED lighting sheet for animal/plant growth, including an array of LED chips, and a controller electrically connected to the LED lighting sheet for animal/plant growth, and a constant voltage is applied from the controller to the LED lighting sheet for animal/plant growth.

The LED lighting sheet for animal/plant growth according to the present embodiment and the LED lighting sheet for animal/plant growth, included in the LED lighting module for animal/plant growth according to the present embodiment, each are a sheet LED lighting unit, so the overall thickness is reduced as compared to an LED bar light including an array of straight-tube LEDs. Therefore, a vertical space between shelves of an animal/plant growth rack can be reduced to improve the floor area yield of an animal/plant growth factory for animals and/or plants grown. Because the thickness of the LED chips is less than the thickness of the LED straight tubes, the LED lighting sheet reduces a difference in height between a region where the LED chips are placed and a region where the LED chips are not placed as compared to a difference in height between a region where the LED straight tubes are placed and a region where the LED straight tubes are not placed. Therefore, a shadow hardly appears to the side of each LED chip, so variations of light irradiated to animals and/or plants are reduced even when the animals and/or plants grow up and get close to the LED lighting sheet. In the LED lighting unit for animal/plant growth, a reduction of variations of light irradiated to animals and/or plants leads to a reduction of nonconforming products by setting the size and quality of animals and/or plants grown within the range of certain specifications, so it is important. In growing animals and/or plants, control over light and heat irradiated to animals and/or plants during a late growth stage in which animals and/or plants grow up and photosynthesis becomes active is important. The LED lighting sheet for animal/plant growth according to the present embodiment is capable of reducing variations of relatively strong light irradiated to animals and/or plants when the animals and/or plants are close to the LED lighting sheet.

The LED lighting sheet for animal/plant growth according to the present embodiment has a total luminous flux of 3000 lm or more, so the growth rate of animals and/or plants grown can be increased while a decrease in the yield of animals and/or plants grown is suppressed, with the result that animals and/or plants are obtained with a high yield. In the LED lighting unit for animal/plant growth, even when the growth rate of animals and/or plants is tried to be increased by simply increasing the amount of light, but when variations of the light are not reduced, variations further increase, and nonconforming products increase, with the result that the yield may decrease on the contrary. With the sheet LED lighting unit, even when light has a total luminous flux of 3000 lm or more, variations of the light are reduced, and a high yield is obtained.

The LED lighting module for animal/plant growth according to the present embodiment includes an LED lighting sheet for animal/plant growth, and a controller electrically connected to the LED lighting sheet, the LED lighting sheet for animal/plant growth has a total luminous flux of 3000 lm or more, and the controller is externally connected to the LED lighting sheet.

Since the LED lighting module for animal/plant growth according to the present embodiment includes the external controller, the growth rate of animals and/or plants grown can be increased while a decrease in the yield of animals and/or plants grown is suppressed, with the result that animals and/or plants are obtained with a high yield. Heat that is locally generated around the controller has a strong effect on animals and/or plants grown near the controller and has a small effect on animals and/or plants grown far from the controller. Therefore, variations occur in growth conditions of animals and/or plants and lead to many nonconforming products, with the result that the yield may decrease. When the amount of light of the LED lighting sheet increases, heat generated from the controller increases. With the LED lighting module in which the controller is externally connected to the LED lighting sheet externally, the controller can be installed at any location, so the variations are reduced, and a high yield is obtained. Particularly, with the LED lighting module in which the controller is externally connected to the LED lighting sheet, even when the LED lighting sheet that irradiates light having a total luminous flux of 3000 lm or more is used, the controller can be installed at any location, so the variations are reduced, and a high yield is obtained.

In the LED lighting module for animal/plant growth according to the present embodiment, a constant voltage is applied to the LED lighting sheet for animal/plant growth from the controller, so the accumulated amount of light per unit time from the LED lighting sheet can be increased. In other words, for example, the accumulated amount of light in the case where a constant voltage is applied to the LED lighting sheet can be made greater than the accumulated amount of light in the case where a voltage is applied in pulse waveform. With this configuration, the luminous efficiency of light from the LED lighting sheet is enhanced, and the growth efficiency of animals and/or plants is improved. As a result, the growth rate of animals and/or plants grown can be increased while a decrease in the yield of animals and/or plants grown is suppressed, with the result that animals and/or plants are obtained with a high yield. Even when the growth rate of animals and/or plants is tried to be increased by simply increasing the accumulated amount of light in the LED lighting unit for animal/plant growth, but when variations of the light are not reduced, variations further increase, and nonconforming products increase, with the result that the yield may decrease on the contrary. With the sheet LED lighting unit, variations of the light are reduced, and a high yield is obtained.

A shelf for an animal/plant growth rack, an animal/plant growth rack, and an animal/plant growth factory according to the present embodiment each include the LED lighting sheet or module for animal/plant growth according to the present embodiment, so animals and/or plants are obtained with a high yield.

Hereinafter, the first embodiment will be specifically described with reference to the drawings. The drawings described below are schematically shown. Therefore, the size and shape of each portion are exaggerated as needed for the purpose of easy understanding. The first embodiment may be modified as needed without departing from the technical idea. In the drawings described below, like reference signs denote the same portions, and the detailed description may be partially omitted. The numeric values, such as dimensions, and material names of members described in the specification are illustrative as the embodiment and are not limited thereto. The numeric values and material names may be selected and used as needed. In the specification, terms that specify shapes and geometrical conditions, for example, terms, such as parallel, perpendicular, and vertical, mean not only the strict senses of the terms but also substantially the same states. In the specification, animal/plant mean animals and/or plants. Hereinafter, for the sake of convenience, an example in which plants are grown (cultivated) with the LED lighting module will be described. It is also applicable to the case where animals are grown as long as no contradiction arises.

(LED Lighting Module for Plant Growth)

An LED lighting module 10 for plant growth (hereinafter, also referred to as LED lighting module 10) according to the present embodiment, shown in FIG. 1, is installed in a plant growth factory 90 (FIG. 7) using artificial light and used to grow plants, as will be described later. The LED lighting module 10 includes an LED lighting sheet 20 for plant growth (hereinafter, also referred to as LED lighting sheet 20) and a controller 40 electrically connected to the LED lighting sheet 20.

Figure 2:
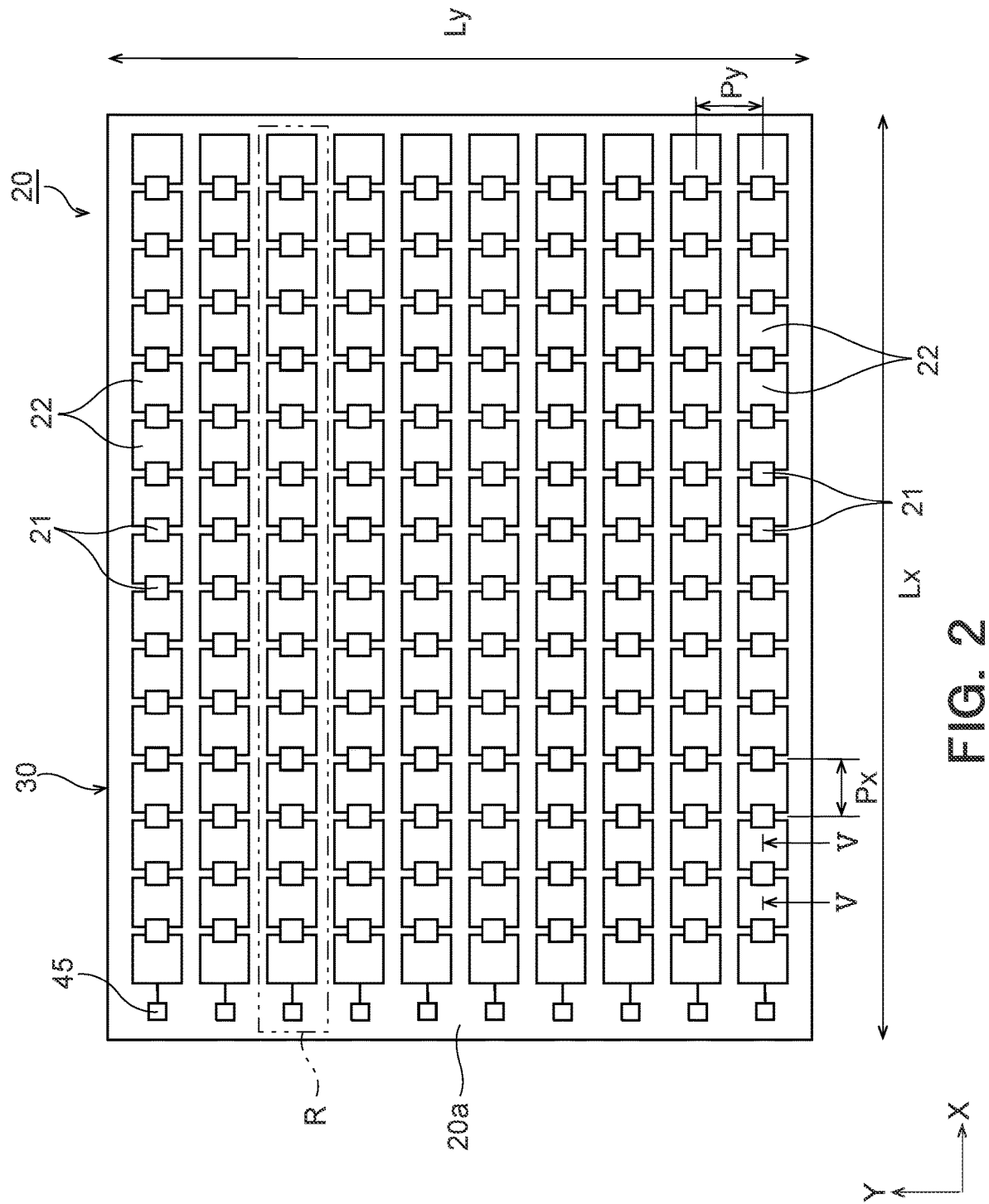
FIG. 2 is a plan view showing the LED lighting sheet according to the first embodiment.

As shown in FIG. 2, the LED lighting sheet 20 is a so-called surface light source sheet and includes an array of LED chips 21 on a light emitting surface 20*a* (a side facing plants during usage) of its sheet surfaces. By using the direct LED lighting sheet 20, irradiating light from the LED chips 21 directly passes through the light emitting surface 20a and directly reaches plants immediately, so the growth of plants is facilitated by increasing the amount of light, and a shadow hardly appears to the side of each LED chip 21 by reducing the thickness of the entire sheet. FIG. 2 shows an example of the direct LED lighting sheet 20; however, the configuration is not limited thereto. Alternatively, an edge-lit LED lighting sheet in which a light guide plate or the like is interposed may be used. An edge-lit LED lighting sheet tends to reduce variations in the amount of light from the light emitting surface 20a. The LED lighting sheet 20 of FIG. 2 includes a flexible wiring substrate 30, and the plurality of LED chips 21 regularly arranged on the flexible wiring substrate 30. By using the flexible wiring substrate 30, the LED lighting sheet 20 with a sheet surface having a relatively large area is obtained. Generally, in plant growth factories and plant growth racks, an array of the LED lighting sheets 20 is used; however, when positions between any adjacent two of the LED lighting sheets 20 vary, variations in the amount of light occur, with the result that the yield of plants may decrease. The LED lighting sheet 20 with a sheet surface having a relatively large area can reduce the number of the LED lighting sheets 20 to be used, so variations in the amount of light due to placement of a plurality of the LED lighting sheets 20 are reduced. FIG. 2 shows an example of the LED lighting sheet 20 including the flexible wiring substrate 30; however, the configuration is not limited thereto. Alternatively, an LED lighting sheet including a rigid wiring board may be used. An LED lighting sheet including a rigid wiring board has a high resistance to stress and is hard to break. In FIG. 2, a light reflection insulating protective film 34 and a transparent protective film 35, described later, are not shown.

In this case, the LED chips 21 are arranged in a grid point manner in plan view in the flexible wiring substrate 30. In other words, the LED chips 21 are arranged in a matrix of multiple rows and multiple columns, and N rows of an array R in which the M LED chips 21 are connected in series are arranged. For example, in FIG. 2, the 14 LED chips 21 (M=14) are connected in series along a first array direction (X direction) of the LED chips 21. In addition, the 10 rows R (N=10) of the array R of the 14 LED chips 21 are arranged in parallel along a second array direction (Y direction) of the LED chips 21. The number of the LED chips 21 arranged is not limited thereto. Specifically, it is preferable that the 10 or more and 14 or less (14≥M≥10) LED chips 21 be arranged in series in the first array direction (X direction) and the four or more and 10 or less rows (10≥N≥4) of the array R be arranged in parallel in the second array direction (Y direction) of the LED chips 21. By arranging the 10 or more LED chips 21 in series, the LED chips 21 are arranged at a narrow pitch along the first array direction (X direction), and in-plane variations in the illuminance of the LED lighting sheet 20 are reduced, so variations of light irradiated to plants are reduced. By arranging the 14 or less LED chips 21 in series, power consumption is reduced, so a running cost, such as light and fuel expenses, in the plant growth factory 90 is reduced. By arranging the four or more rows of the LED chips 21 in the second array direction (Y direction) of the LED chips 21 in parallel, even when a specific one or some of the LED chips 21 break, influences on the LED chips 21 in other rows are suppressed, and an excessive decrease in the illuminance of the overall LED lighting sheet 20 is suppressed. By limiting the range in which the illuminance of the LED lighting sheet 20 is decreased, the range in which nonconforming products may occur is limited, with the result that a decrease in yield is suppressed. To obtain the LED lighting sheet 20 that irradiates light having a total luminous flux of 3000 lm or more, the performance of the LED chips 21 needs to be improved. For this reason, limiting the influence of a break of a specific one or some of the LED chips 21 as much as possible is important from the viewpoint of risk management. When the LED lighting sheet 20 is of a direct type, the LED chips 21 may be highly likely to be erroneously touched strongly and broken at the time of installation or cleaning, so it is important to take measures at the time of a break from the viewpoint of risk management. By arranging the 10 or less rows of the LED chips 21 in parallel, power consumption is reduced, so a running cost, such as light and fuel expenses, in the plant growth factory 90 is reduced.

The LED lighting sheet 20 includes a plurality of metal wiring portions 22. The plurality of metal wiring portions 22 is arranged along the first array direction (X direction). The plurality of metal wiring portions 22 arranged along the first array direction (X direction) is in correspondence with each of the rows R of the LED chips 21. Each of the LED chips 21 is placed so as to bridge a pair of the metal wiring portions 22 adjacent to each other in the X direction. The terminals (not shown) of each LED chip 21 are respectively electrically connected to the pair of metal wiring portions 22. The plurality of metal wiring portions 22 makes up a power feeding portion to the LED chips 21. When electric power is supplied to the plurality of metal wiring portions 22, all the LED chips 21 arranged in the row R light up. The plurality of metal wiring portions 22 partially makes up a metal wiring portion 32 (described later).

The pitch Px of the LED chips 21 in the first array direction (X direction) is preferably greater than or equal to 37 mm and less than or equal to 50 mm. The pitch Py of the LED chips 21 in the second array direction (Y direction) is preferably greater than or equal to 37 mm and less than or equal to 100 mm. By setting the pitches of the LED chips 21 to the above ranges, variations of light irradiated to plants are reduced by equalizing the brightness of the LED lighting sheet 20 in the plane, and the power consumption of the LED lighting sheet 20 is reduced.

The thickness of a thickest part in the LED lighting sheet 20 is preferably less than or equal to 5 mm. In this way, by reducing the thickness of the LED lighting sheet 20, a vertical space between boards 81 (FIG. 8) on which the LED lighting sheets 20 are installed can be narrowed. Thus, the number of boards 81 per each plant growth rack 80 (FIG. 8) can be increased. As a result, the crop yield of plants per unit area can be increased. Variations of relatively strong light irradiated to plants when the plants are close to the LED lighting sheet 20 are reduced.

Figure 3A:
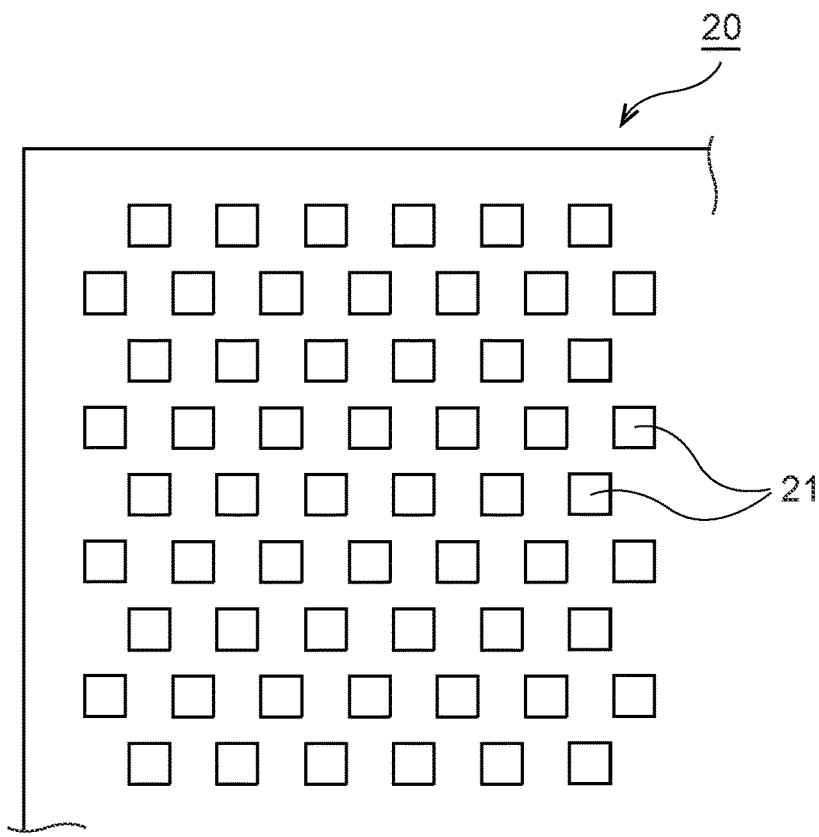
FIG. 3A is a plan view showing a modification of the LED lighting sheet.
Figure 3B:
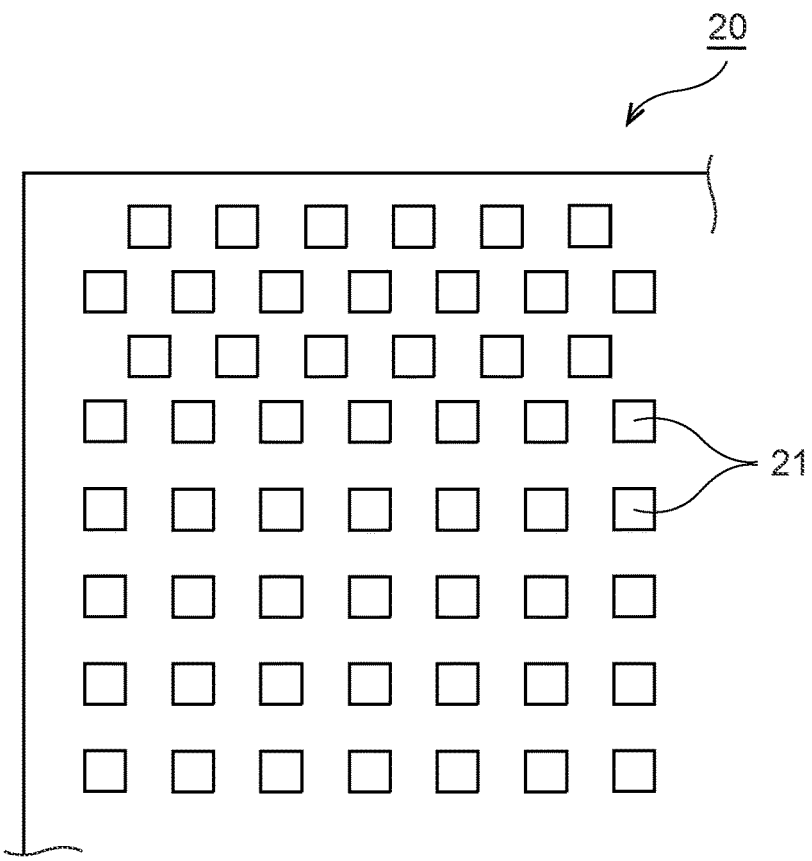
FIG. 3B is a plan view showing a modification of the LED lighting sheet.

The LED chips 21 are not limited to arrangement in a grid point manner in plan view. Alternatively, as shown in FIG. 3A, the LED chips 21 may be arranged in a staggered manner in plan view. Alternatively, the LED chips 21 do not need to be arranged uniformly in the plane of the LED lighting sheet 20. For example, the density of the LED chips 21 may be increased at the peripheral part of the LED lighting sheet 20. Specifically, as shown in FIG. 3B, the LED chips 21 may be arranged in a grid point manner at the center part (the lower part in FIG. 3B) of the LED lighting sheet 20, and the LED chips 21 may be arranged in a staggered manner at the peripheral part (the upper part in FIG. 3B) of the LED lighting sheet 20. Thus, a decrease in the brightness of the LED lighting sheet 20 at the peripheral part of the LED lighting sheet 20 is suppressed, and variations of light irradiated to plants are reduced by equalizing the brightness of the LED lighting sheet 20 in the plane.

The overall shape of the LED lighting sheet 20 is a rectangular shape in plan view; however, the size and planar shape of the LED lighting sheet 20 are not limited. The LED lighting sheet 20 has a high degree of flexibility in size and shape processing, the LED lighting sheet 20 is able to flexibly meet various demands in terms of these points. By taking advantage of the flexibility, the LED lighting sheet 20 can be attached to not only a flat installation surface but also installation surfaces of various shapes. Since the LED lighting sheet 20 itself has stiffness, when, for example, the LED lighting sheet 20 is bent in a cylindrical shape such that the LED chips 21 are placed on the outside, the LED lighting sheet 20 alone can be used as a light even without an installation surface.

In FIG. 2, the length Lx of the LED lighting sheet 20 in the first array direction (X direction) is preferably greater than or equal to 500 mm and less than or equal to 700 mm and more preferably greater than or equal to 550 mm and less than or equal to 650 mm. The length Ly of the LED lighting sheet 20 in the second array direction (Y direction) is preferably greater than or equal to 300 mm and less than or equal to 500 mm and more preferably greater than or equal to 350 mm and less than or equal to 450 mm. By setting the size of the LED lighting sheet 20 within the above ranges, the LED lighting sheet 20 can be adapted to the general board 81 (FIG. 8) for plant cultivation (plant growth), so the dead space of the board 81 is reduced. Because of the fact that the size of each individual LED lighting sheet 20 is not excessively large, when a specific one or some of the LED chips 21 break, influences on the other LED chips 21 are minimized, an extreme decrease in the illuminance of the shelf 83 (FIG. 8) for a plant growth rack as a whole is prevented, and the range in which the illuminance decreases is limited.

In the present embodiment, the total luminous flux of the LED lighting sheet 20 is preferably 3000 lm or more and more preferably 3900 lm or more. The total luminous flux can be measured with a goniophotometer (for example, Goniophotometric Measurement System GP-2000 produced by Otsuka Electronics Co., Ltd.). Measurement conditions for total luminous flux are such that measurement is performed in a stable state after a state where a direct-current voltage of 44 V is applied to the LED lighting sheet 20 for five minutes. The LED lighting sheet 20 is set on a biaxial rotation stage, the vertical angle is rotated from 0° to 360° in 5° increments, and a luminous intensity (cd) at a photometric distance of 12 m is measured. Thus, a luminous intensity distribution in a horizontal angle of 0° to 180° is obtained. When the LED lighting sheet 20 is rotated 90° and measurement of the vertical angle is similarly performed, a luminous intensity distribution in a horizontal angle of 90° to 270° is obtained. A total luminous flux (lm) is calculated through computation from data on the angular dependency of luminous intensity. When the LED lighting sheet 20 is capable of controlling lighting, a maximum value is used in the present embodiment.

In this way, when a total luminous flux from the LED lighting sheet 20 is increased, the growth of plants is accelerated while a decrease in yield is suppressed, with the result that the growth rate of plants can be increased and the number of growth days can be reduced. As a result, the yield of plants in the plant growth factory 90 is improved. In other words, hitherto, for straight-tube LED light bars, light irradiated to plants varies when the lighting unit gets close to the plants, and there are only surface light source sheets with low output power. In the present embodiment, the total luminous flux of the LED lighting sheet 20 is 3000 lm or more and more preferably 3900 lm or more. In comparison with the case where existing straight-tube LED light bars or surface light source sheets are used, the yield of plants is improved.

The photosynthetic photon flux density PPFD of the LED lighting sheet 20 is preferably greater than or equal to 50 $\mu mol \cdot m^{-2} \cdot s^{-1}$ and less than or equal to 300 $\mu mol \cdot m^{-2} \cdot s^{-1}$ and more preferably greater than or equal to 200 $\mu mol \cdot m^{-2} \cdot s^{-1}$ and less than or equal to 300 $\mu mol \cdot m^{-2} \cdot s^{-1}$. The PPFD is a value measured at a location immediately below the LED chips 21 and 20 cm away from the LED chips 21. By setting the PPFD within the above range, a PPFD that is needed for the growth of plants is sufficiently provided in the plant growth factory 90, and the growth of plants is accelerated. A PPFD can be measured with a measuring instrument, such as a quantameter (for example, Quantum sensor LI-190R and Light meter LI-250A produced by LI-COR, Inc. U.S.). Quantum sensor LI-190R is placed horizontally with respect to a cultivation surface (or a light source), discretely arranged in a matrix according to a cultivation area, and numeric values are read in a state where figures indicating the amounts of light are stable. Reading of numeric values is performed in a state of being calibrated to eigenvalues of the sensor with Light meter. In the present embodiment, a numeric value of PPFD is expressed by an average of the numeric values measured in the matrix.

Next, the controller 40 will be described. As shown in FIG. 1, the controller 40 supplies electric power to the LED lighting sheet 20 and controls light emission and the like of the LED lighting sheet 20. The controller 40 is detachably connected to the LED lighting sheet 20 via a first connector 44A provided on the LED lighting sheet 20. In other words, the controller 40 is provided separately from the LED lighting sheet 20 and is externally connected to the LED lighting sheet 20. In other words, the controller 40 is not integrated with the LED lighting sheet 20. With this configuration, the controller 40 that is a heat source can be isolated from the LED lighting sheet 20, so heat from the controller 40 does not to influence the growth of plants.

The controller 40 includes a power input section 41, an AC/DC converter (driver) 42, and a PWM control section 43. Of these, for example, alternating-current voltage having a selected voltage of 100 V to 240 V is supplied to the power input section 41. The AC/DC converter 42 converts the alternating-current voltage of 100 V to 240 V to a constant direct-current voltage (for example, 44 V). The PWM control section 43 controls the lighting of the LED chips 21 of the LED lighting sheet 20 by changing the pulse width of a constant voltage waveform from the AC/DC converter 42 to a selected width. In other words, the PWM control section 43 also plays a role as a light control section that controls the lighting of the LED lighting sheet 20. The constant voltage output from the PWM control section 43 is applied to the LED lighting sheet 20 via the first connector 44A.

Figure 4A:
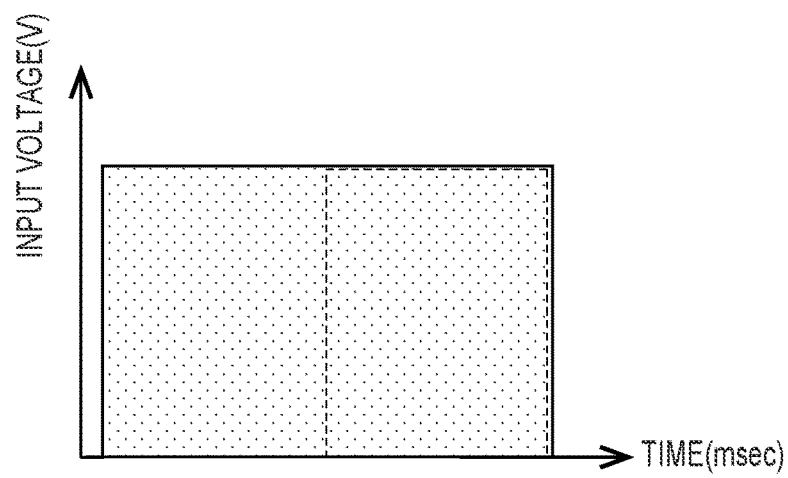
FIG. 4A is a graph showing the relationship between time and voltage in the case where a constant voltage is applied from a controller to the LED lighting sheet.

When the constant voltage is applied from the PWM control section 43 of the controller 40 to the LED lighting sheet 20, the lighting of the LED chips 21 can be controlled unlike the case where a rectified pulse voltage is directly applied to the LED lighting sheet 20. In other words, the PWM control section 43 is capable of controlling the illuminance of the LED chips 21 to a selected illuminance by changing the duty ratio of the direct-current voltage from the AC/DC converter 42 as needed. For example, as shown in FIG. 4A, the PWM control section 43 is capable of reducing the illuminance of the LED chips 21 by reducing the duty ratio of the constant voltage from the AC/DC converter 42 from 100% (continuous line) to 50% (dashed line).

By adjusting the illuminance of the LED chips 21 as needed in this way, the degree of growth of plants can be adjusted by adjusting the illuminance of the LED lighting sheet 20 according to a plant growth stage. For example, the illuminance of the LED lighting sheet 20 may be reduced in an early growth stage in which the leaves of plants are small, and the illuminance of the LED lighting sheet 20 may be increased in a late growth stage where the leaves of plants are large. Alternatively, the illuminance of the LED lighting sheet 20 may be increased in an early growth stage where the heights of plants are low because the distance between plants and the LED chips 21 is long, and the illuminance of the LED lighting sheet 20 may be reduced in a late growth stage where the heights of plants are high because the distance between plants and the LED chips 21 is short. As another example of adjusting the illuminance of the LED lighting sheet 20, the illuminance may be increased in the case of types of plants that need a high illuminance, and the illuminance may be reduced in the case of types of plants that can be grown even at a low illuminance. The illuminance may be increased when shipping timing needs to be advanced, and the illuminance may be reduced when shipping timing needs to be delayed. The LED lighting sheet 20 that irradiates light having a total luminous flux of 3000 lm or more has a wide adjustable range of illuminance, so there is a big advantage of making it possible to control the lighting of the LED chips 21. In the case of the LED lighting sheet 20 having a low amount of light, even when a light control function is imparted, the LED lighting sheet 20 is eventually used at an illuminance around the maximum, so there is a small advantage of having a light control function.

Figure 4B:
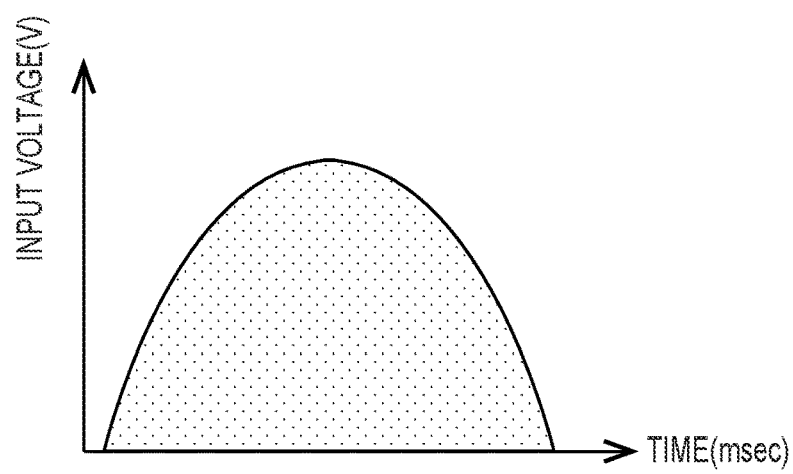
FIG. 4B is a graph showing the relationship between time and voltage in the case where a pulse is applied to the LED lighting sheet as a comparative example.

When the constant voltage is applied from the PWM control section 43 to the LED lighting sheet 20, an accumulated amount of light per unit time of light from the LED lighting sheet 20 can be increased. In other words, for example, an accumulated amount of light (the area of a shaded part in FIG. 4A) in the case where the constant voltage is applied to the LED lighting sheet 20 can be increased as compared to an accumulated amount of light (the area of a shaded part in FIG. 4B) in the case where a voltage is applied in pulse as a comparative example. With this configuration, the luminous efficiency of light from the LED lighting sheet 20 is enhanced, and the growth efficiency of plants is improved.

Referring again to FIG. 1, the LED lighting sheet 20 includes regulators 45. In this case, the regulators 45 are respectively provided in correspondence with the rows of the LED chips 21, and specifically the 10 regulators 45 are provided in correspondence with the 10 rows of the LED chips 21. Each of the regulators 45 plays a role in maintaining a constant current flowing through the plurality of LED chips 21 of the associated row. With this configuration, even when one of the LED chips 21 breaks, flow of an excessive current through the LED chips 21 in other rows is suppressed, so a break of the LED chips 21 in other rows is prevented. As a result, an extreme decrease in the illuminance of the overall LED lighting sheet 20 is prevented, so variations of light irradiated to plants are reduced. The regulators 45 are capable of controlling the amounts of current controlled by connected resistance values row by row and, are capable of increasing output power only in the rows at peripheral parts by, for example, changing the controlling resistance values for the first row and the last row. With this configuration, normally, uniformity is intended to be ensured by spreading the LED lighting sheets 20 without any gap; however, even when the LED lighting sheets 20 are placed with a spacing of about 5 cm to about 10 cm from the viewpoint of cost and the viewpoint of ensuring ventilation, the effect of eliminating the joint is expected.

Furthermore, the LED lighting sheet 20 includes a power supply line 46 that branches off from the first connector 44A. A second connector 44B is provided on the LED lighting sheet 20. The power supply line 46 is not electrically connected to the LED chips 21 of the LED lighting sheet 20 and is electrically connected to wires of another LED lighting sheet 200 having the same configuration as the LED lighting sheet 20. In other words, the power supply line 46 is detachably connected to the wires of the another LED lighting sheet 200 via the second connector 44B and another first connector 44A provided on the another LED lighting sheet 200. A current from the power supply line 46 is supplied to the another LED lighting sheet 200 via the second connector 44B and the another first connector 44A. With this configuration, the two LED lighting sheets 20, 200 can be coupled, and these two LED lighting sheets 20, 200 can be controlled at the same time by the single controller 40. Since the single controller 40 is capable of controlling the plurality of LED lighting sheets 20, 200 at the same time, the number of the controllers 40 that are heat generating sources is reduced. Therefore, even when the LED lighting sheet 20 that irradiates light having a total luminous flux of 3000 lm or more is used, variations in the growth of plants due to heat from the controller 40 are hard to occur, so a decrease in yield is suppressed.

(Members of LED Lighting Sheet)

Figure 5:
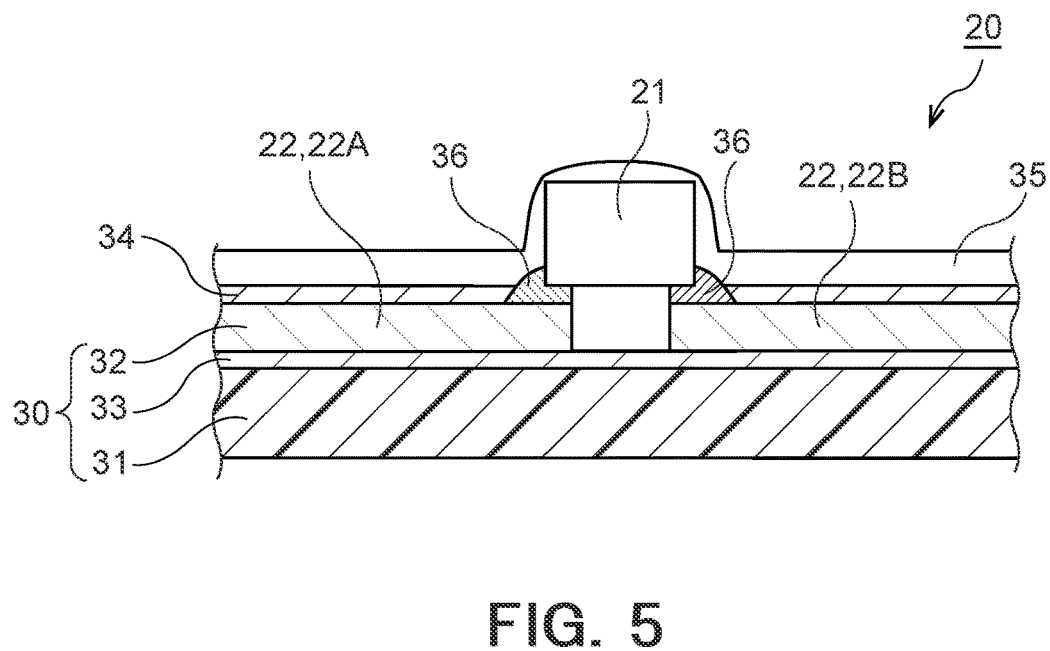
FIG. 5 is a sectional view (sectional view taken along the line V-V in FIG. 2) showing the LED lighting sheet according to the first embodiment.

Next, members that make up the LED lighting sheet 20 will be described. As shown in FIG. 5, the LED lighting sheet 20 includes the flexible wiring substrate 30, and the plurality of LED chips 21 placed on the flexible wiring substrate 30. Of these, the flexible wiring substrate 30 has a substrate film 31 having flexibility, and the metal wiring portion 32 formed on the surface (the surface of the light emitting surface 20*a* side) of the substrate film 31. The metal wiring portion 32 is laminated on the substrate film 31 via an adhesive layer 33.

Each of the LED chips 21 is implemented so as to be able to conduct to the metal wiring portion 32. In the LED lighting sheet 20, since the LED chips 21 are implemented on the flexible wiring substrate 30, the plurality of LED chips 21 can be placed with a desired high density.

The light reflection insulating protective film 34 is formed so as to cover the LED lighting sheet 20 in a region, other than the region in which the LED chips 21, the regulators 45, the first connector 44A, and the second connector 44B are provided or their peripheral regions. The light reflection insulating protective film 34 is placed so as to cover the metal wiring portion 32. The light reflection insulating protective film 34 is a layer having an electrically insulating function that contributes to improvement in the migration resistance properties of the LED lighting sheet 20 and a light reflection function that contributes to improvement in light environment created by the LED lighting sheet 20. This layer is made of an electrically insulating resin composition containing a white pigment. When the migration resistance properties and the light reflection function are obtained only with the metal wiring portion 32 and the transparent protective film 35 (described later), a structure with no light reflection insulating protective film 34 is possible.

The transparent protective film 35 is formed so as to cover the light reflection insulating protective film 34 and the LED chips 21. The transparent protective film 35 is a resin film formed at the outermost surface (the surface closest to the light emitting surface 20*a* side) of the LED lighting sheet 20 to mainly ensure the waterproofness of the LED lighting sheet 20. The transparent protective film 35 according to the present embodiment may be formed with, for example, a formation method of spraying a transparent resin composition by spraying (hereinafter, referred to as spray coating) or a formation method by curtain coating.

Solder portions 36 are provided on the metal wiring portion 32. Each of the LED chips 21 is electrically connected to the metal wiring portion 32 via the solder portions 36. Each of the LED chips 21 may be implemented on the metal wiring portion 32 via a conductive resin.

(Substrate Film)

A resin film having flexibility may be used as the substrate film 31. In the specification, the phrase "having flexibility" means "to be bendable to a radius of curvature of at least less than or equal to 1 m, preferably 50 cm, more preferably 30 cm, further preferably 10 cm, and particularly preferably 5 cm".

A high heat resistant, electrically insulating thermoplastic resin may be used as the material of the substrate film 31. A polyimide resin (PI) or polyethylene naphthalate (PEN) having high heat resistance, dimensional stability during heating, mechanical strength, and durability may be used as such a resin. Of these polyethylene naphthalate (PEN) having improved heat resistance and dimensional stability imparted through a heat resistance improving treatment, such as annealing, may be preferably used. Polyethylene terephthalate (PET) having improved flame resistance imparted by adding a flame-resistant inorganic filler or the like may be used.

The thickness of the substrate film 31 is not limited and is preferably greater than or equal to about 10 μm and less than or equal to about 500 μm and more preferably greater than or equal to 50 μm and less than or equal to 250 μm from the viewpoint that the substrate film 31 does not become a bottleneck as a heat dissipation path and has heat resistance and electrical insulation properties, and a balance with a manufacturing cost. From the viewpoint of maintaining good productivity in the case of manufacturing by a roll-to-roll process as well, the thickness preferably falls within the above range.

(Adhesive Layer)

Known resin adhesives may be used as needed for an adhesive that forms the adhesive layer 33. Of those resin adhesives, a urethane adhesive, a polycarbonate adhesive, a silicone adhesive, an ester adhesive, an acrylic adhesive, an epoxy adhesive, or the like may be particularly preferably used.

(Metal Wiring Portion)

The metal wiring portion 32 is a wiring pattern formed on the surface (the surface of the light emitting surface 20a side) of the substrate film 31 from a conductive base material, such as metal foil. The metal wiring portion 32 is preferably formed on the surface of the substrate film 31 via the adhesive layer 33 by dry lamination. The metal wiring portion 32 includes the above-described plurality of metal wiring portions 22. The plurality of metal wiring portions 22 includes a first metal wiring portion 22A and a second metal wiring portion 22B placed apart from the first metal wiring portion 22A. The LED chip 21 is mounted on the first metal wiring portion 22A and the second metal wiring portion 22B, and the LED chip 21 is electrically connected to the first metal wiring portion 22A and the second metal wiring portion 22B. The LED chip 21 lights up by electric power supplied to the first metal wiring portion 22A and the second metal wiring portion 22B.

The metal wiring portion 32 is preferably the one that achieves both heat dissipation and electrical conductivity at a high level, and, for example, copper foil may be used. In this case, heat dissipation from the LED chips 21 is stable and an increase in electrical resistance is suppressed, so light emission variations among the LED chips 21 reduce, with the result that stable light emission is possible. The life of the LED chips 21 is also extended. Degradation of peripheral members including the substrate film 31 and the like due to heat is also suppressed, so the product life of the LED lighting sheet 20 is also extended. Examples of the metal that forms the metal wiring portion 32 include metals, such as aluminum, gold, and silver, in addition to the above-described copper.

The thickness of the metal wiring portion 32 may be set as needed according to, for example, the magnitude of withstand current required from the flexible wiring substrate 30. To suppress warpage caused by heat shrinkage of the substrate film 31 during reflow soldering process or the like, the thickness of the metal wiring portion 32 is preferably greater than or equal to 10 On the other hand, the thickness of the metal wiring portion 32 is preferably less than or equal to 50 With this configuration, sufficient flexibility of the flexible wiring substrate 30 is maintained, so a decrease in handling or the like due to an increase in weight is also suppressed.

(Solder Portion)

The solder portions 36 join the metal wiring portion 32 with the LED chips 21. Joining with solder may be performed with any one of two methods, that is, a reflow method and a laser method.

(LED Chip)

The LED chip 21 is a light-emitting element that uses light emission at a p-n junction part at which a p-type semiconductor and an n-type semiconductor are joined together. The LED chip 21 may have a structure such that a p-type electrode and an n-type electrode are respectively provided at the upper and lower surfaces of an element or may have a structure such that both a p-type electrode and an n-type electrode are provided at one side of an element.

In the present embodiment, the total luminous flux of the LED lighting sheet 20 is increased to 3000 lm or more and more preferably to 3900 lm or more. Therefore, the one having a high luminous flux is preferably used as each of the LED chips 21. Specifically, the one having a luminous flux of 30 lm or more is preferably used as the LED chip 21, and the one having a luminous flux of 35 lm or more is more preferably used as the LED chip 21. The one having high luminous efficiency is preferably selected as the LED chip 21. Specifically, the one having a luminous efficiency of 150 lm/W or higher is preferably used as the LED chip 21, and the one having a luminous efficiency of 180 lm/W or higher is more preferably used as the LED chip 21. When the luminous efficiency of the LED chip 21 is increased to 150 lm/W or higher, the number (density) of LED chips 21 implemented can be reduced, and heat generation due to Joule heat from the LED chips 21 can be reduced, so variations in the growth of plants due to heat from the LED chips 21 are hard to occur, with the result that a decrease in yield is suppressed.

The LED lighting sheet 20 is the one in which the LED chips 21 are directly implemented on the metal wiring portion 32 capable of exercising high heat dissipation as described above. With this configuration, even in the case where the LED chips 21 are placed in high density, excessive heat to be generated during lighting of the LED chips 21 is rapidly diffused through the metal wiring portion 32 and sufficiently dissipated to the outside of the LED lighting sheet 20 via the substrate film 31, so variations in the growth of plants due to heat from the LED chips 21 are hard to occur, with the result that a decrease in yield is suppressed.

(Light Reflection Insulating Protective Film)

The light reflection insulating protective film 34 is a layer formed in a region, other than the region in which the LED chips 21 are provided or their peripheral regions. The light reflection insulating protective film 34 is a so-called resist layer to improve the migration resistance properties of the flexible wiring substrate 30 with sufficient electrical insulation properties and is also a light reflection layer having light reflectivity that contributes to improvement in the luminous brightness of light environment created by the LED lighting sheet 20.

The light reflection insulating protective film 34 may be formed by using various resin compositions having a urethane resin or the like as a base resin and further containing a white pigment made up of an inorganic filler, such as titanium oxide. Other than a urethane resin, an acrylic polyurethane resin, a polyester resin, a phenolic resin, or the like may be used as the base resin of the resin composition used to form the light reflection insulating protective film 34. For the base resin of the resin composition that forms the light reflection insulating protective film 34, the same or same-series resin as the resin composition that forms the transparent protective film 35 is preferably used as the base resin. For the transparent protective film 35, an acrylic polyurethane resin is preferably used as a main material resin as will be described later. Thus, when the base resin of the resin composition that forms the transparent protective film 35 is an acrylic polyurethane resin, the base resin of the resin composition for forming the light reflection insulating protective film 34 is more preferably a urethane resin or an acrylic polyurethane resin.

In addition to titanium oxide, at least one selected from among alumina, barium sulfate, magnesia, aluminum nitride, boron nitride, barium titanate, kaolin, talc, calcium carbonate, zinc oxide, silica, mica powder, granulated glass, powdered nickel, and powdered aluminum may be used as the inorganic filler to be contained as a white pigment in the resin composition that forms the light reflection insulating protective film 34.

The thickness of the light reflection insulating protective film 34 is greater than or equal to 5 μm and less than or equal to 50 μm and more preferably greater than or equal to 7 μm and less than or equal to 20 μm. When the thickness of the light reflection insulating protective film 34 is less than 5 μm, the light reflection insulating protective film is thin particularly at an edge part of the metal wiring portion 32. When the metal wires are not covered and exposed, the risk of not maintaining electrical insulation properties increases. On the other hand, from the viewpoint of holding the light reflection insulating protective film 34 against a bend of the substrate at the time of handling, conveyance, or the like, the thickness of the light reflection insulating protective film 34 is preferably less than or equal to 50 μm.

At wavelengths of greater than or equal to 400 nm and less than or equal to 780 nm, the average light reflectance of the light reflection insulating protective film 34 is preferably higher than or equal to 65%, more preferably higher than or equal to 70%, and further preferably higher than or equal to 80% in any case. In the LED lighting sheet 20, for example, by containing 20 parts by mass or more of titanium oxide for 100 parts by mass of urethane or acrylic polyurethane base resin, the light reflectance of the layer in the case where the thickness of the light reflection insulating protective film 34 is set to 8 μm can be higher than or equal to 75%.

(Transparent Protective Film)

The transparent protective film 35 is formed at the outermost surface of the LED lighting sheet 20 so as to cover the LED chips 21. The transparent protective film 35 has waterproofness and transparency. With the waterproofness of the transparent protective film 35, entry of water into the unit in the case where the LED lighting sheet 20 is used as a plant growth light source is prevented. In the LED lighting sheet 20 that irradiates light having a total luminous flux of 3000 lm or more, the performance of the LED chips 21 needs to be improved, and influences in the case of a break of a specific one or some of the LED chips 21 are large. When the one having a high luminous efficiency, for example, a luminous efficiency of higher than or equal to 150 lm/W, is selected for the LED chips 21, influences in the case of a break of a specific one or some of the LED chips 21 are large in the LED lighting sheet 20. For this reason, making the LED chips 21 hard to break as much as possible is important from the viewpoint of risk management. In addition, with the transparent protective film 35, peeling of the LED chips 21 off from the LED lighting sheet 20 is suppressed.

The transparent protective film 35 may be formed by using various resin compositions having an acrylic polyurethane resin or the like as a base resin. For example, the transparent protective film 35 may be made of a two-component curable acrylic polyurethane resin containing fluorine. Other than an acrylic polyurethane resin, a urethane resin, a polyester resin, a phenolic resin, or the like may be used as the base resin of the resin composition used to form the transparent protective film 35. For the base resin of the resin composition that forms the transparent protective film 35, the same or same-series resin as the resin composition that forms the light reflection insulating protective film 34 is preferably used as the base resin. Preferred specific combinations may include a combination of a urethane resin as the base resin of the resin composition that forms the light reflection insulating protective film 34 and an acrylic polyurethane resin as the resin that forms the transparent protective film 35.

The thickness of the transparent protective film 35 is greater than or equal to 10 μm and less than or equal to 40 μm, preferably greater than or equal to 15 μm and less than or equal to 30 μm, and more preferably greater than or equal to 20 μm and less than or equal to 25 μm. By setting the thickness of the transparent protective film 35 within the above range, the good flexibility and thinness, lightweight properties, and good optical characteristics desired for plant growth application, of the LED lighting sheet 20 are maintained. In addition, sufficient waterproofness desired for plant growth application is obtained for the LED lighting sheet 20.

The surface of the transparent protective film 35 may be hydrophilic. With this configuration, when water adheres to the transparent protective film 35, the adherent water is distributed so as to spread along the surface of the transparent protective film 35. Therefore, it is possible to reduce adherent water remaining at locations corresponding to the LED chips 21 as liquid droplets. As a result, the good optical characteristics of the LED lighting sheet 20 are effectively maintained.

The water resistance of the LED lighting sheet 20 from the transparent protective film 35 is not limited as long as degradation of the LED chips 21 is suppressed when water for plant growth is sprayed to the LED lighting sheet 20.

Such water resistance preferably exhibits IPX4 or higher in the waterproof and dustproof standards stipulated by IEC (International Electrotechnical Commission). Waterproofness higher than or equal to IPX4 is a level to which water splashes against the LED chips 21 from any direction have no harmful effect. Specifically, the level is such that water sprayed over all the range of ±180° with respect to the direction normal to the LED lighting sheet 20 for five minutes at a water volume of 10 liters per minute has no harmful effect on the LED chips 21.

(Manufacturing Method for LED Lighting Sheet)

Next, a manufacturing method for the LED lighting sheet 20 according to the present embodiment will be described with reference to FIG. 6A to FIG. 6H.

Figure 6A:
FIG. 6A is sectional view showing a manufacturing method for the LED lighting sheet according to the first embodiment.
Figure 6B:
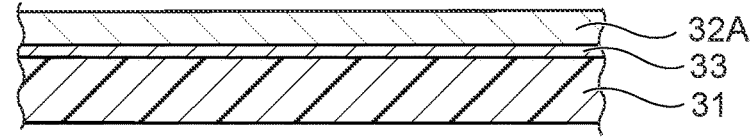
FIG. 6B is sectional view showing a manufacturing method for the LED lighting sheet according to the first embodiment.

Initially, the substrate film 31 is prepared (FIG. 6A). Subsequently, metal foil 32A, such as copper foil, which is the material of the metal wiring portion 32, is laminated on the surface of the substrate film 31 (FIG. 6B). The metal foil 32A is bonded to the surface of the substrate film 31 by the adhesive layer 33 of, for example, a urethane adhesive or the like. Alternatively, the metal foil 32A may be directly formed on the surface of the substrate film 31 by electrolytic plating or vapor deposition (sputtering, ion plating, electron-beam evaporation, vacuum evaporation, chemical vapor deposition, or the like). Alternatively, the substrate film 31 may be directly deposited on the metal foil 32A.

Figure 6C:
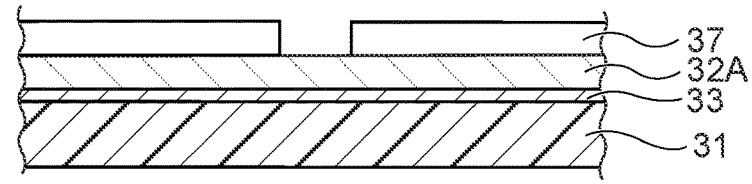
FIG. 6C is sectional view showing a manufacturing method for the LED lighting sheet according to the first embodiment.

After that, an etching mask 37 patterned in a shape required for the metal wiring portion 32 is formed on the surface of the metal foil 32A (FIG. 6C). The etching mask 37 is provided such that a part corresponding to the wiring pattern of the metal foil 32A, which becomes the metal wiring portion 32, does not corrode with etchant. A method of forming the etching mask 37 is not limited. For example, a photoresist or a dry film may be exposed to light through a photomask and then developed, or an etching mask may be formed on the surface of the metal foil 32A by a printing technology of an ink-jet printer or the like.

Figure 6D:
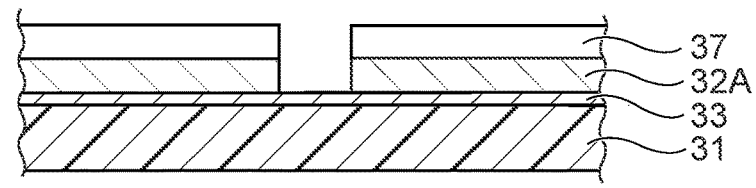
FIG. 6D is sectional view showing a manufacturing method for the LED lighting sheet according to the first embodiment.

Subsequently, the metal foil 32A at locations not covered with the etching mask 37 is removed by immersion liquid (FIG. 6D). As a result, a part other than the part to be the metal wiring portion 32 in the metal foil 32A is removed.

Figure 6E:
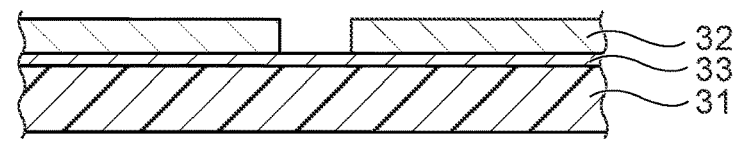
FIG. 6E is sectional view showing a manufacturing method for the LED lighting sheet according to the first embodiment.

After that, the etching mask 37 is removed by using alkaline stripper to remove the etching mask 37. As a result, the etching mask 37 is removed from the surface of the metal wiring portion 32 (FIG. 6E).

Figure 6F:
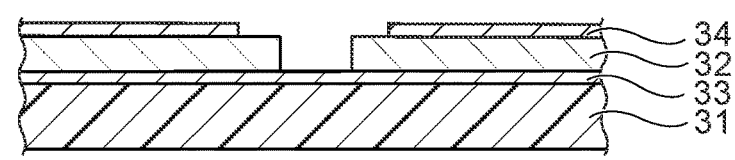
FIG. 6F is sectional view showing a manufacturing method for the LED lighting sheet according to the first embodiment.

Subsequently, the light reflection insulating protective film 34 is laminated on the metal wiring portion 32 (FIG. 6F). Formation of the light reflection insulating protective film 34 is not limited as long as a coating method is capable of uniformly coating a material resin composition that makes up the light reflection insulating protective film 34, and, for example, a method, such as screen printing, offset printing, dip coater, and brush coating, may be used. Alternatively, the light reflection insulating protective film 34 may be formed by coating an insulating protective film material having photosensitivity over the entire surface, exposing only necessary portions to light through a photomask, and then developing.

Figure 6G:
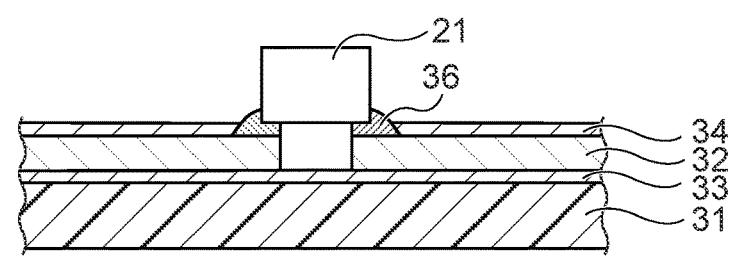
FIG. 6G is sectional view showing a manufacturing method for the LED lighting sheet according to the first embodiment.
Figure 6H:
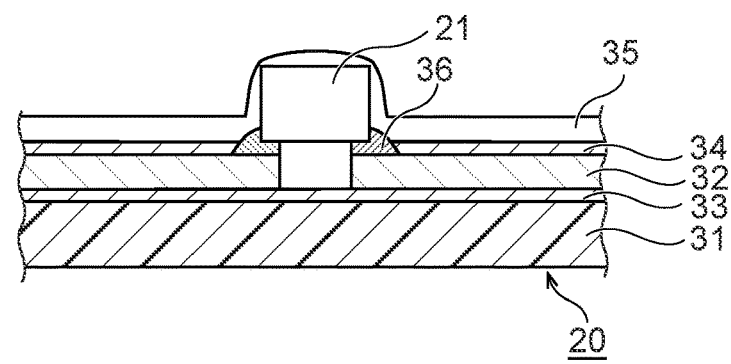
FIG. 6H is sectional view showing a manufacturing method for the LED lighting sheet according to the first embodiment.

After that, the LED chips 21, the regulators 45, and the connectors 44A, 44B are implemented on the metal wiring portion 32 (FIG. 6G). In FIG. 6G and FIG. 6H (described later), the regulators 45 and the like are not shown for clear illustration. In this case, each LED chip 21 is joined with the metal wiring portion 32 via the solder portions 36 by soldering. Joining by soldering may be performed by a reflow method or a laser method or may be joining with a conductive resin.

Subsequently, the transparent protective film 35 is formed so as to cover the light reflection insulating protective film 34, the LED chips 21, the regulators 45, and the connectors 44A, 44B (FIG. 6H). The transparent protective film 35 is preferably formed by a formation method by spraying a transparent resin composition by spraying process (hereinafter, referred to as spray coating) or a formation method by curtain coating. Formation of the transparent protective film 35 by spray coating can be performed in a manner such that, for example, a coating film is formed by spraying coating liquid containing acrylic polyurethane resin to a desired region on the flexible wiring substrate 30 with a spray coater. Formation of the transparent protective film 35 by curtain coating can be performed in a manner such that, for example, a coating film is formed by dripping curtain coating liquid containing acrylic polyurethane resin to a desired region on the flexible wiring substrate 30 with a curtain coater.

Not limited to the above-described methods, the LED lighting sheet 20 according to the present embodiment can be manufactured by known methods of manufacturing an existing known flexible wiring substrate for LED chips or various LED modules formed by implementing LED chips on the flexible wiring substrate.

(Plant Growth Factory and Plant Growth Rack)

Figure 7:
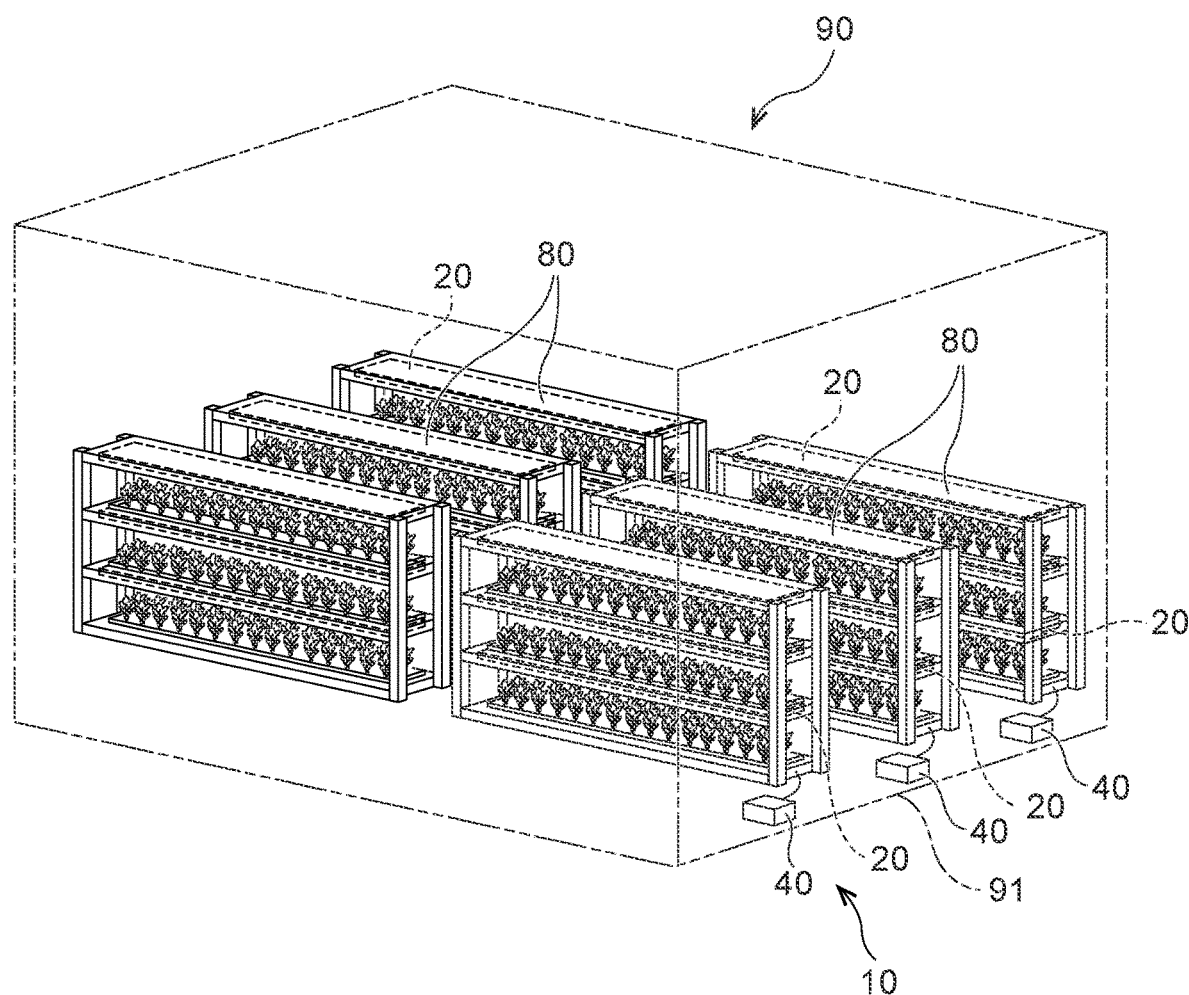
FIG. 7 is a schematic perspective view showing a plant growth factory according to the first embodiment.

FIG. 7 is a view schematically showing the configuration of the plant growth factory 90 using the LED lighting sheets 20 according to the present embodiment. The plant growth factory 90 includes a building 91 and a plurality of plant growth racks 80 placed in the building 91.

Figure 8:
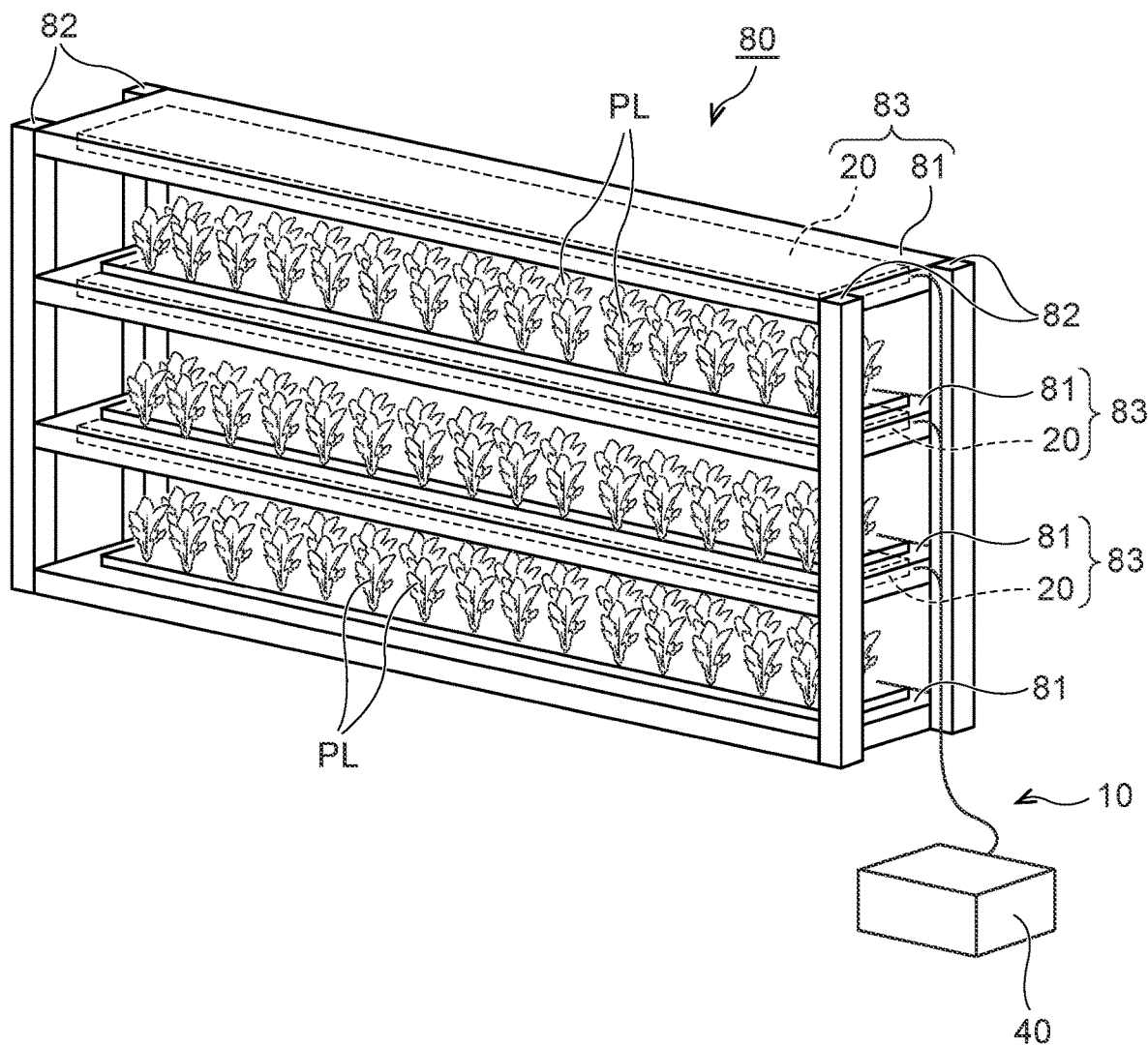
FIG. 8 is a schematic perspective view showing a plant growth rack according to the first embodiment.

As shown in FIG. 8, the plant growth rack 80 includes a plurality of (four) posts 82, and a plurality of boards 81 placed with a vertical clearance along the posts 82. A culture medium region for cultivating plants PL is provided on the upper surface of each board 81 except the topmost board 81. The lower surface of each board 81 except the bottommost board 81 makes up a ceiling surface for the board 81 located below the board 81, and the LED lighting sheets 20 are arranged in parallel. In this case, the controller 40 is placed at a location sufficiently away from the LED lighting sheets 20. For this reason, there are small concerns about variations in growth due to heat from the controller 40 between plants PL located closer to the controller 40 and plants PL located far from the controller 40. The shelf 83 for a plant growth rack is made up of the board 81 and the LED lighting sheet 20 attached to the lower side of the board 81. Alternatively, the shelf 83 for a plant growth rack is made up of the board 81 and the LED lighting module 10 attached to the lower side of the board 81. In the present embodiment, the shelf 83 (FIG. 8) for a plant growth rack, the plant growth rack 80 (FIG. 8), and the plant growth factory 90 (FIG. 7) including the plant growth racks 80 are provided.

The LED lighting sheet 20 according to the present embodiment has flexibility and lightweight properties, so attaching the LED lighting sheet 20 to the lower side of each board 81 is easier than attaching an existing straight-tube lighting unit or the like. In addition, the LED lighting sheet 20 has flexibility, so the LED lighting sheet 20 can be attached to ceiling surfaces having various sizes and shapes. As a result, the LED lighting sheet 20 according to the present embodiment is applicable to various plant growth racks 80 and plant growth factories 90.

The LED lighting sheet 20 is made thinner than an existing straight-tube lighting unit. Thus, the vertical clearance between the boards 81 can be narrowed, so the number of the boards 81 included in each plant growth rack 80 can be increased. As a result, the crop yield of plants PL per unit area can be increased.

Figure 9A:
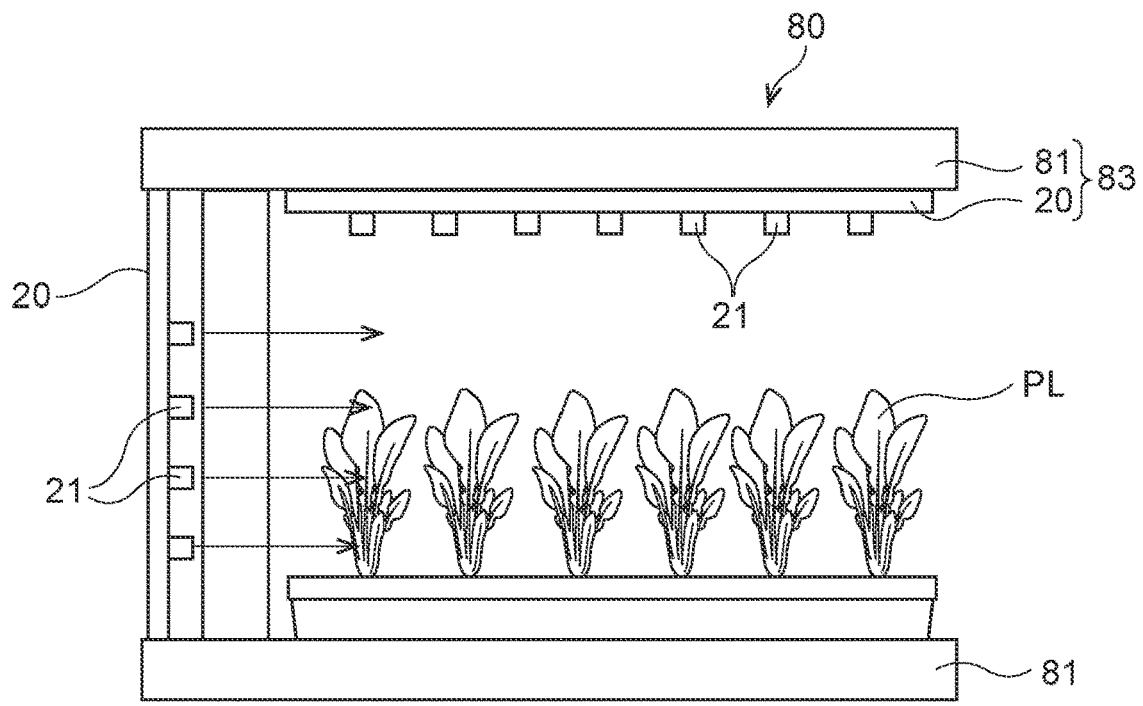
FIG. 9A is view showing a modification of the plant growth rack.
Figure 9B:
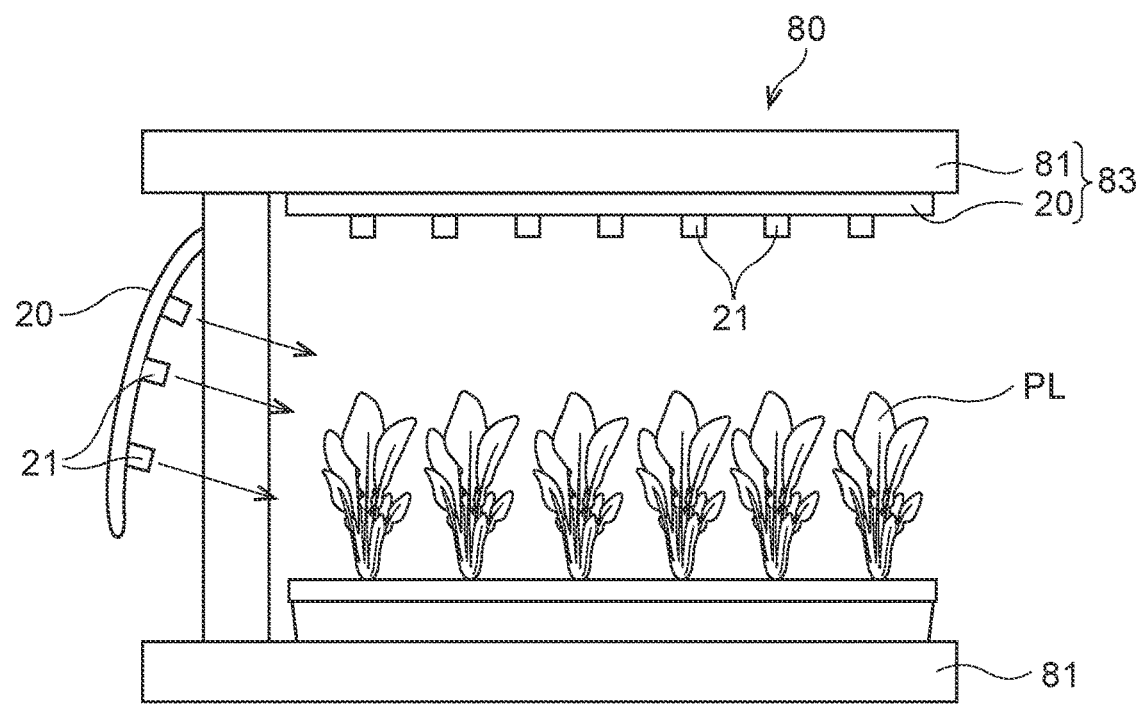
FIG. 9B is view showing a modification of the plant growth rack.

As shown in FIG. 9A and FIG. 9B, the LED lighting sheet 20 may be placed not only on the lower side of the board 81 but also to the side of the board 81. The side LED lighting sheet 20 is hung from the upper board 81 toward the lower board 81 located below the upper board 81. In this case, as shown in FIG. 9A, the LED lighting sheet 20 may reach the lower board 81. Alternatively, as shown in FIG. 9B, the LED lighting sheet 20 may cover only the upper side of the space located between the upper and lower boards 81 without reaching the lower board 81. In this way, when the LED lighting sheet 20 is further placed to the side of the board 81, the amount of light at the periphery of the board 81 where the illuminance tends to decrease is compensated, with the result that the brightness of the LED lighting sheet 20 can be equalized in the plane. As a result, the growth of plants can be equalized in the plane, so the yield of plants grown is improved.

Operation of Present Embodiment

Next, the operation of the present embodiment configured as described above will be described.

Initially, the power input section 41 (see FIG. 2) of the LED lighting module 10 is connected to a power supply, and, for example, an alternating current having a selected voltage of 100 V to 240 V is supplied to the power input section 41. Subsequently, a current input to the power input section 41 is converted to a constant direct-current voltage (for example, 44 V) by the AC/DC converter 42. Subsequently, a direct-current voltage from the AC/DC converter 42 is adjusted in the pulse width of a constant voltage waveform in the PWM control section 43, and the LED chips 21 are controlled to a predetermined luminous flux. For example, as shown in FIG. 4A, the PWM control section 43 changes the pulse width of a constant voltage waveform to decrease the duty ratio from 100% (continuous line) to 50% (dashed line). After that, a constant voltage from the PWM control section 43 is supplied to the LED lighting sheet 20, and the LED chips 21 light up.

Light from the LED chips 21 of the LED lighting sheet 20 reaches plants placed on the board 81 and accelerates the growth of the plants. In the present embodiment, since the LED lighting sheet 20 has a sheet shape, light is uniformly irradiated from the LED chips 21 of the LED lighting sheet 20 to plants, so an imbalance in the growth speeds of plants due to nonuniform illuminance is reduced. On the other hand, when an LED bar light in which existing straight-tube LEDs are arranged is used as a comparative example, particularly, the amount of light to plants located between the straight-tube LEDs becomes insufficient, and an imbalance in the growth speeds of plants may occur.

In this way, according to the present embodiment, since the total luminous flux of the LED lighting sheet 20 is 3000 lm or more, light intensity needed in the plant growth factory 90 is sufficiently obtained from the LED lighting sheet 20, so the growth of plants is good.

According to the present embodiment, the LED chips 21 have a luminous efficiency of 150 lm/W or higher. With this configuration, the power consumption is suppressed while the total luminous flux of the LED lighting sheet 20 is maintained at a high level, with the result that the energy efficiency of the LED lighting sheet 20 is enhanced. In addition, heat generation due to Joule heat from the LED chips 21 can be reduced by reducing the number (density) of LED chips 21 implemented.

According to the present embodiment, the 10 or more LED chips 21 are arranged in series, and four or more rows of the LED chips 21 are arranged in parallel. With this configuration, the LED chips 21 are equally placed in the plane, and arrays of the LED chips 21 are placed in parallel, so the risk at the time of a break of one or some of the LED chips 21 can be dispersed.

According to the present embodiment, the LED chips 21 are covered with the transparent protective film 35, so the LED chips 21 are protected from moisture that spatters during growth of plants.

According to the present embodiment, since the thickness of the thickest part in the LED lighting sheet 20 is less than or equal to 5 mm, the yield of plants per unit area can be increased by reducing the distance between the upper and lower boards 81 of the plant growth rack 80 and increasing the number of the boards 81.

According to the present embodiment, the controller 40 is externally connected to the LED lighting sheet 20, so it is possible to eliminate the influence of heat from the controller 40 on plants by placing the controller 40 away from the LED lighting sheet 20.

According to the present embodiment, a constant voltage is applied from the controller 40 to the LED lighting sheet 20, so the growth of plants can be accelerated by increasing the accumulated amount of light per unit time from the LED chips 21.

According to the present embodiment, the controller 40 is capable of controlling the lighting of the LED chips 21, so the intensity of light from the LED chips 21 can be adjusted according to a growth stage of plants.

According to the present embodiment, a constant voltage is applied from the controller 40 to the LED lighting sheet 20, so the growth of plants can be accelerated by increasing the accumulated amount of light per unit time from the LED chips 21. In other words, an accumulated amount of light (the area of a shaded part in FIG. 4A) in the case where the constant voltage is applied to the LED lighting sheet 20 can be increased as compared to an accumulated amount of light (the area of a shaded part in FIG. 4B) in the case where a voltage is applied in pulse as a comparative example. With this configuration, plants can be obtained with a high yield by enhancing the growth speed of plants and growing plants more efficiently. Since the accumulated amount of light per unit time increases, the power consumption is reduced, so a running cost, such as light and fuel expenses, in the plant growth factory 90 is further reduced.

According to the present embodiment, the controller 40 is capable of controlling the lighting of the LED chips 21, so the amount of light from the LED chips 21 can be adjusted according to a growth stage, type, and the like of plants. When, for example, a small amount of light from the LED chips 21 is sufficient as in an early plant growth stage, the amount of light from the LED chips 21 can be adjusted to a small amount; whereas, when the amount of light from the LED chips 21 needs to be increased as in a late plant growth stage, the amount of light from the LED chips 21 can be increased. Alternatively, the illuminance of the LED lighting sheet 20 may be increased in an early growth stage where the heights of plants are low because the distance between plants and the LED chips 21 is long, and the illuminance of the LED lighting sheet 20 may be reduced in a late growth stage where the heights of plants are high because the distance between plants and the LED chips 21 is short. Other than the above, the illuminance of the LED lighting sheet 20 may be increased when plants of types that need a high illuminance are cultivated, and the illuminance of the LED lighting sheet 20 may be reduced when plants of types that can be grown at a low illuminance are cultivated. The illuminance of the LED lighting sheet 20 may be increased when the timing of shipping is intended to be advanced, and the illuminance of the LED lighting sheet 20 may be reduced when the timing of shipping is intended to be delayed. In this way, by adjusting the amount of light from the LED chips 21 where necessary, the growth of plants can be freely controlled. In addition, the power consumption is reduced, so a running cost, such as light and fuel expenses, in the plant growth factory 90 is further reduced.

According to the present embodiment, the controller 40 is externally connected to the LED lighting sheet 20, so it is possible to eliminate the influence of heat from the controller 40 on plants by placing the controller 40 away from the LED lighting sheet 20. In other words, as a comparative example, if the controller 40 is integrated with the LED lighting sheet 20, heat from the controller 40 is easily transferred from the controller 40 to plants located near the controller 40 and heat from the controller 40 is difficult to be transferred from the controller 40 to plants located far from the controller 40 when plants are grown with the plant growth rack 80. In this case, uneven temperature occurs in the atmosphere over the plants, so there are concerns about uneven growth of plants in the plane. In contrast, according to the present embodiment, since the controller 40 is externally connected to the LED lighting sheet 20, the controller 40 can be sufficiently placed away from plants, with the result that an occurrence of uneven temperature over plants due to heat from the controller 40 is suppressed, and the growth of plants can be made uniform in the plane. As a result, plants are obtained with a high yield.

EXAMPLES

Next, specific examples of the present embodiment will be described.

(Preparation of LED Lighting Sheet)

LED lighting sheets of Example 1, Example 2, and Comparative Example 1 were prepared as follows. LED lighting modules of Example 3 and Comparative Example 2 were prepared as follows.

Example 1

Copper foil (thickness 35 μm) for forming a metal wiring portion was laminated on one of the surfaces of a 560 mm×390 mm film substrate (polyethylene naphthalate, thickness 50 μm), and then the copper foil for metal wires was subjected to etching to form the metal wiring portion with the same pattern in all the examples and comparative examples. Then, a light reflection insulating protective film with a thickness of 10 μm was formed on the substrate film and the metal wiring portion by screen printing using electrically insulating ink made up of a urethane resin as a base resin and 20 percent by mass of titanium oxide added to the base resin. Subsequently, a plurality of LED chips ("NFSW757G-V2" (produced by NICHIA Corporation)) was implemented on the metal wiring portion in a matrix of 14 rows by 10 columns by soldering at a pitch of 40 mm in the X direction and at a pitch of 35 mm in the Y direction. The LED chips were top emission-type light-emitting elements and had a rectangular parallelepiped outer shape with a size of 3.0 mm (length)×3.0 mm (width)×0.65 mm (height). The LED chips each had a color temperature of 3000K, a luminous flux of 36.2 lm, and a luminous efficiency of 196 lm/W. Furthermore a transparent protective film that covers the electrically insulating protective film and the LED chips was formed by spray coating. The LED lighting sheet prepared as described above was used as the LED lighting sheet of Example 1.

Example 2

The LED lighting sheet prepared similarly to Example 1 was used as the LED lighting sheet of Example 2 except that the total luminous flux of the LED sheet was controlled to 3000 lm with a dimmer.

Example 3

The LED lighting sheet prepared similarly to Example 1 was connected to a controller, and the LED lighting module was prepared. A 200 V alternating-current power supply was connected to the controller, and 44 V constant voltage was applied from the controller to the LED lighting sheet. At this time, the duty ratio of direct-current voltage to the LED lighting sheet was set to 100%.

Comparative Example 1

The LED lighting sheet prepared similarly to Example 1 was used as the LED lighting sheet of Comparative Example 1 except that LED chips ("NFSW757D-V1" (produced by NICHIA Corporation)) having a luminous flux of 12.6 lm and a luminous efficiency of 67 lm/W were used.

Comparative Example 2

Regulators were removed from the LED lighting sheet of Example 3, a half-wave rectification-type rectification driver was provided on the LED lighting sheet instead, and AC 200 V was connected to the rectification driver. Thus, the LED lighting module was prepared.

For the LED lighting sheets of Example 1, Example 2, and Comparative Example 1, the optical characteristics, specifically, the total luminous flux and the photosynthetic photon flux density (PPFD), were measured. The total luminous flux was measured with a goniophotometer (for example, Goniophotometric Measurement System GP-2000 produced by Otsuka Electronics Co., Ltd.). The photosynthetic photon flux density (PPFD) was measured with a quantameter (Quantum sensor LI-190R produced by Meiwafosis Co., Ltd.). For the LED lighting sheets of Example 1, Example 2, and Comparative Example 1, a total luminous flux (lm/W) and a photosynthetic photon flux density (PPFD/W) relative to a total input power (W) were calculated.

Subsequently, the LED lighting sheets of Example 1, Example 2, and Comparative Example 1 and the LED lighting modules of Example 3 and Comparative Example 2 each were attached to a plant growth rack, and plants (baby spinach) were actually cultivated. After that, fresh weights ($g/m^2$) were measured as the growth rates of plants grown. The fresh weights were measured by measuring aboveground part fresh weight after completion of cultivation for each cultivation panel and calculating a weight per square meter. A fresh weight per day ($g/m^2/day$) that was a fresh weight per cultivation days was calculated. The above evaluation results are shown in Table 1 and Table 2.

TABLE 1

|  | EXAMPLE 1 | EXAMPLE 2 | COMPARATIVE EXAMPLE 1 |
|---|---|---|---|
| COLOR TEMPERATURE (K) | 3000 | 3000 | 3000 |
| TOTAL LUMINOUS FLUX (lm) | 3900 | 3000 | 2350 |
| TOTAL INPUT POWER (W) | 180 | 137 | 138 |
| LAMP EFFICIENCY (lm/W) | 123 | 123 | 102 |
| CULTIVATION LIGHT ENVIRONMENT AVERAGE PPFD ($\mu mol/m^2/s$) | 463 | 267 | 177 |
| PPFD/W | 2.57 | 1.95 | 1.28 |
| CULTIVATION DAYS (DAYS) | 11 | 11 | 12 |
| FRESH WEIGHT ($g/m^2$) | 2100 | 1650 | 1300 |
| FRESH WEIGHT PER DAY ($g/m^2/day$) | 191 | 150 | 108 |
|  | (176.9%) | (138.9%) | (100%) |

TABLE 2

|  | EXAMPLE 3 | COMPARATIVE EXAMPLE 2 |
|---|---|---|
| INPUT AC VOLTAGE (V) | 200 | 200 |
| OUTPUT DC VOLTAGE WAVEFORM | RECTANGULAR (CONSTANT VOLTAGE DRIVE) | HALF-WAVE RECTIFICATION WAVEFORM |
| CULTIVATION DAYS (DAYS) | 11 | 12 |
| FRESH WEIGHT ($g/m^2$) | 2100 | 1350 |
| FRESH WEIGHT PER DAY ($g/m^2/day$) | 191 | 112.5 |
|  | (170%) | (100%) |

As shown in Table 1, when the LED lighting sheets of Example 1 and Example 2 were used, the fresh weight of plants was increased as compared to the case where the LED lighting sheet of Comparative Example 1 was used. Particularly, when the LED lighting sheet of Example 1 was used, the fresh weight of plants was significantly increased although cultivation days were shorter by one day than the case where the LED lighting sheet of Comparative Example 1 was used. Specifically, when the LED lighting sheet (total luminous flux 3900 lm) of Example 1 was used, the fresh weight per day ($g/m^2/day$) was increased by about 77% as compared to the case where the LED lighting sheet (total luminous flux 2350 lm) of Comparative Example 1 was used. When the LED lighting sheet (total luminous flux 3000 lm) of Example 2 was used, the fresh weight per day ($g/m^2/day$) was increased by about 39% as compared to the case where the LED lighting sheet (total luminous flux 2350 lm) of Comparative Example 1 was used. In this way, when the LED lighting sheets of Example 1 and Example 2 were used, the productivity of plants was improved by increasing the total luminous flux of light from the LED chips.

As shown in Table 2, when the LED lighting module of Example 3 was used, the fresh weight of plants was increased as compared to the case where the LED lighting module of Comparative Example 2 was used. Specifically, when the LED lighting module of Example 3 was used, the fresh weight of plants was increased by about 70% as compared to the case where the LED lighting module of Comparative Example 2 was used. In this way, when the LED lighting module of Example 3 was used, the productivity of plants was improved by increasing the accumulated amount of light per unit time from the LED chips.

Second Embodiment

An LED lighting unit for animal/plant growth according to a second embodiment includes an array of LED chips, and a light source color of each of the LED chips is an incandescent or a warm white, of light source colors defined in JISZ9112.

Since the light source color of each of the LED chips is the incandescent or the warm white, of the light source colors defined in JISZ9112 in the LED lighting unit for animal/plant growth according to the present embodiment, the growth rate of animals and/or plants grown can be increased while a decrease in the yield of animals and/or plants grown is suppressed, with the result that animals and/or plants are obtained with a high yield. Incidentally, a major task of an animal/plant growth factory that cultivates plants by using artificial light is to improve profitability. Elements for improving profitability are presumably, in the case of, for example, plants, not only selecting high-price objects to be cultivated but also growth acceleration for growing big in a short period, reduction of cost, such as an initial cost and a running cost, and the like. For example, as an idea of accelerating growth by facilitating photosynthesis, there is a growth control technique using two types of LED chips including red LED chips and blue LED chips. However, when two-type LED chips are used, two-type LED chips need to be prepared, and it is difficult to reduce cost. In recent years, it has been proven that even leaf vegetables perform photosynthesis by absorbing green light. For this reason, white LED chips are sufficient for light sources, and it is desired to efficiently grow plants with an LED lighting unit using mass-produced white LED chips. In contrast, since the light source color of each of the LED chips is the incandescent or the warm white, of the light source colors defined in JISZ9112, according to the present embodiment, plants can be efficiently grown, with the result that plants are obtained with a high yield.

An LED lighting unit for animal/plant growth according to the present embodiment includes an array of LED chips, an emission spectrum of light from the LED chips has a first peak with a center wavelength of greater than or equal to 610 nm and less than or equal to 630 nm, a second peak with a center wavelength of greater than or equal to 440 nm and less than or equal to 460 nm, and a third peak with a center wavelength of greater than or equal to 510 nm and less than or equal to 530 nm, a relative emission intensity in the first peak is higher than a relative emission intensity in the second peak, and a relative emission intensity in the third peak is lower than the relative emission intensity in the second peak.

In the LED lighting unit for animal/plant growth according to the present embodiment, an emission spectrum S of light from the LED chips 21 has a first peak P1 with a center wavelength of greater than or equal to 610 nm and less than or equal to 630 nm, a second peak P2 with a center wavelength of greater than or equal to 440 nm and less than or equal to 460 nm, and a third peak P3 with a center wavelength of greater than or equal to 510 nm and less than or equal to 530 nm. A relative emission intensity in the center wavelength of the first peak P1 is higher than a relative emission intensity in the center wavelength of the second peak P2, and a relative emission intensity in the center wavelength of the third peak P3 is lower than the relative emission intensity in the center wavelength of the second peak P2. With this configuration, light from the LED chips 21 becomes white, and the light source color of the LED chips 21 can be set to an incandescent or a warm white. Therefore, the above-described advantageous effects are obtained.

An LED lighting unit for animal/plant growth according to the present embodiment includes an array of LED chips, light from the LED chips has a first component with a center wavelength of greater than or equal to 610 nm and less than or equal to 630 nm and a half width of greater than or equal to 90 nm and less than or equal to 110 nm, a second component with a center wavelength of greater than or equal to 440 nm and less than or equal to 460 nm and a half width of greater than or equal to 10 nm and less than or equal to 20 nm, and a third component with a center wavelength of greater than or equal to 510 nm and less than or equal to 530 nm and a half width of greater than or equal to 50 nm and less than or equal to 60 nm, a relative emission intensity in the center wavelength of the first component is higher than a relative emission intensity in the center wavelength of the second component, and a relative emission intensity in the center wavelength of the third component is lower than the relative emission intensity in the center wavelength of the second component.

In the LED lighting unit for animal/plant growth according to the present embodiment, light from the LED chips 21 has a first component C1 with a center wavelength of greater than or equal to 610 nm and less than or equal to 630 nm and a half width of greater than or equal to 90 nm and less than or equal to 110 nm, a second component C2 with a center wavelength of greater than or equal to 440 nm and less than or equal to 460 nm and a half width of greater than or equal to 10 nm and less than or equal to 20 nm, and a third component C3 with a center wavelength of greater than or equal to 510 nm and less than or equal to 530 nm and a half width of greater than or equal to 50 nm and less than or equal to 60 nm. A relative emission intensity in the center wavelength of the first component C1 is higher than a relative emission intensity in the center wavelength of the second component C2, and a relative emission intensity in the center wavelength of the third component C3 is lower than the relative emission intensity in the center wavelength of the second component C2. With this configuration, light from the LED chips 21 becomes white, and the light source color of the LED chips 21 can be set to an incandescent or a warm white. Therefore, the above-described advantageous effects are obtained.

An LED lighting unit for animal/plant growth according to present embodiment includes an array of LED chips, and a chromaticity of light from the LED chips falls within a rectangular region connecting four sets of chromaticity coordinates (0.39, 0.36), (0.41, 0.44), (0.46, 0.44), and (0.42, 0.36) in an xy chromaticity diagram.

In the LED lighting unit for animal/plant growth according to present embodiment, a chromaticity of light from the LED chips 21 falls within a rectangular region connecting four sets of chromaticity coordinates (0.39, 0.36), (0.41, 0.44), (0.46, 0.44), and (0.42, 0.36) in an xy chromaticity diagram. In this case, light from the LED chips 21 becomes white, and the light source color of the LED chips 21 can be set to an incandescent or a warm white. Therefore, the above-described advantageous effects are obtained.

An LED lighting module for animal/plant growth according to the present embodiment includes an LED lighting unit for animal/plant growth, and a controller electrically connected to the LED lighting unit, and the controller is externally connected to the LED lighting unit.

Since the LED lighting module for animal/plant growth according to the present embodiment includes the external controller, the growth rate of animals and/or plants grown can be increased while a decrease in the yield of animals and/or plants grown is suppressed, with the result that animals and/or plants are obtained with a high yield. Heat that is locally generated around the controller has a strong effect on animals and/or plants grown near the controller and has a small effect on animals and/or plants grown far from the controller. Therefore, variations occur in growth conditions of animals and/or plants and lead to many nonconforming products, with the result that the yield may decrease. With the LED lighting module in which the controller is externally connected to the LED lighting unit externally, the controller can be installed at any location, so the variations are reduced, and a high yield is obtained.

A shelf for an animal/plant growth rack, an animal/plant growth rack, and an animal/plant growth factory according to the present embodiment each include the LED lighting unit or module for animal/plant growth according to the present embodiment, so animals and/or plants are obtained with a high yield.

Figure 10:
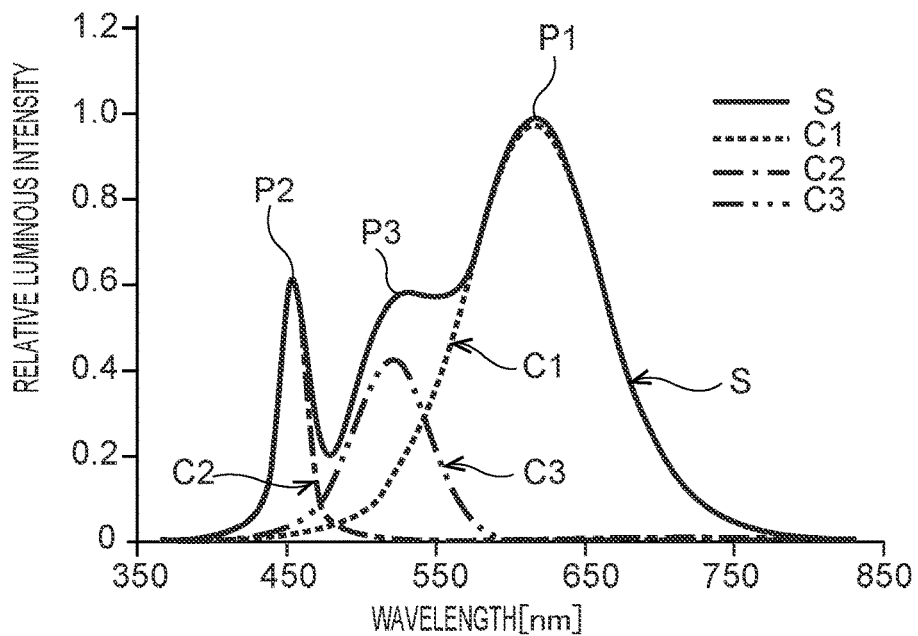
FIG. 10 is a graph showing components and emission spectrum of light from LED chips of an LED lighting sheet according to a second embodiment.
Figure 11:
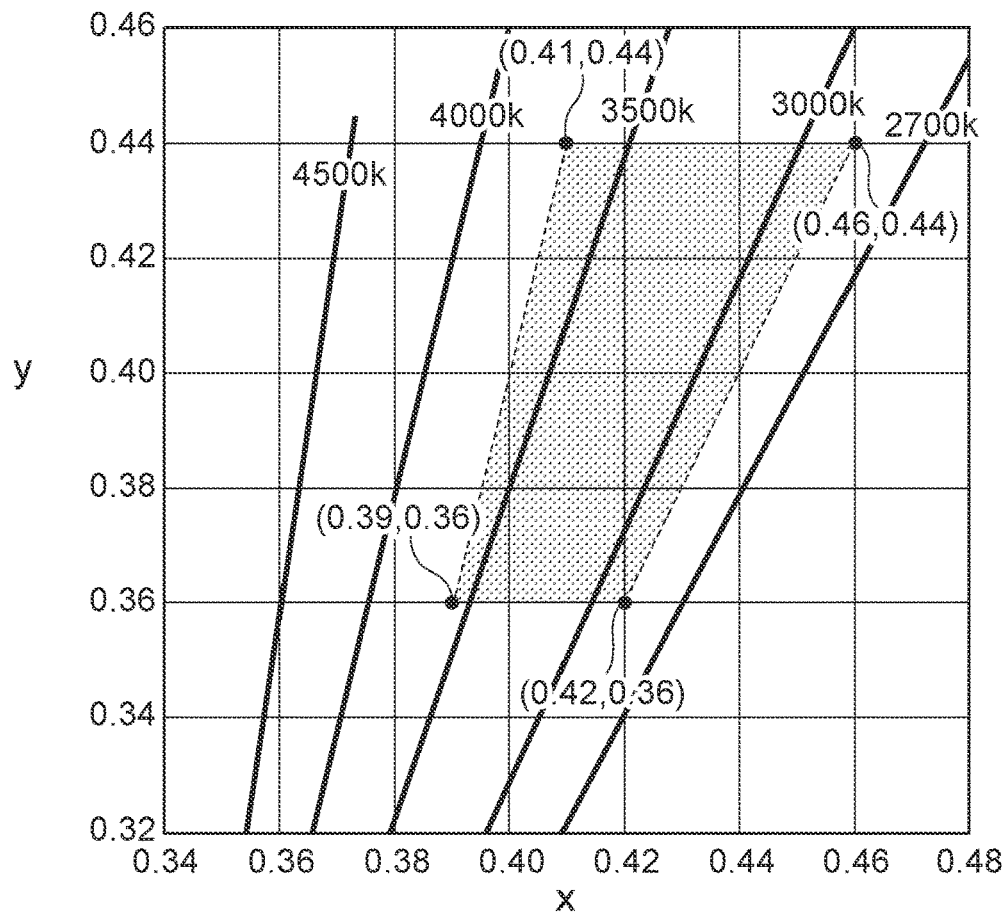
FIG. 11 is an xy chromaticity diagram showing the chromaticity of light from the LED chips of the LED lighting sheet according to the second embodiment and is an xy chromaticity diagram in which constant temperature lines of color temperature are drawn.

Next, the second embodiment will be described with reference to FIG. 10 and FIG. 11. The second embodiment shown in FIG. 10 and FIG. 11 mainly differs from the first embodiment in that the light source color of the LED chips 21 is the incandescent or the warm white, of the light source colors defined in JISZ9112. In FIG. 10 and FIG. 11, like reference signs are assigned to the same portions as those of the first embodiment, and the detailed description is omitted.

In the present embodiment, the light source color of each of the LED chips 21 is the incandescent or the warm white and more preferably the incandescent, of the light source colors defined in JISZ9112. A light source color can be measured with a spectroradiometer (for example, CL-500A produced by KONICA MINOLTA, INC.) in conformity with JISZ9112. At the time of measuring a light source color, initially, calibration of the spectroradiometer is performed. Subsequently, the sensor of the spectroradiometer is directed toward the LED chips 21 that are a measuring object. Then, a measuring button of the spectroradiometer is depressed to start measurement of the light source color.

In this way, when the light source color of the LED chips 21 is the incandescent or the warm white, the growth of plants is accelerated, with the result that the growth rate of plants can be increased, and the number of growth days can be reduced. As a result, the yield of plants in the plant growth factory 90 is improved. When the light source color of the LED chips 21 is the incandescent, the eyes of workers who work in the plant growth factory 90 do not get tired easily, so the working efficiency is improved. The fact that plants can be efficiently grown when the light source color of the LED chips 21 is the incandescent or the warm white will be described by way of examples (described later).

Incidentally, as described above, in the present embodiment, the LED lighting sheet 20 that is a so-called surface light source sheet includes the LED chips 21 of which the light source color is the incandescent or the warm white. Here, it is presumable that the incandescent or the warm white is better in quantum efficiency of photosynthesis than a neutral white. For this reason, when the light source color of the LED chips 21 is the incandescent or the warm white, the growth of plant bodies is accelerated as compared to the case where the light source color of the LED chips 21 is the neutral white.

In this case, the color temperature of light from the LED chips 21 is higher than or equal to 2,600K and lower than or equal to 3,800K, preferably higher than or equal to 2,600K and lower than or equal to 3,250K, and more preferably higher than or equal to 2,850K and lower than or equal to 3,150K. When the color temperature of light from the LED chips 21 is higher than or equal to 2,600K and lower than or equal to 3,800K, the growth of plants is accelerated, with the result that the growth rate of plants can be increased, and the number of growth days can be reduced. As a result, the yield of plants in the plant growth factory 90 is improved.

As shown in FIG. 10, in the present embodiment, an emission spectrum S (see the continuous line in FIG. 10) of light from the LED chips 21 has a first peak P1 with a center wavelength of greater than or equal to 610 nm and less than or equal to 630 nm, a second peak P2 with a center wavelength of greater than or equal to 440 nm and less than or equal to 460 nm, and a third peak P3 with a center wavelength of greater than or equal to 510 nm and less than or equal to 530 nm. In other words, the emission spectrum S has the first peak P1 present in a red wavelength range, the second peak P2 present in a blue wavelength range, and the third peak P3 present in a green wavelength range. The emission spectrum of light from the LED chips 21 can be measured similarly to the light source color with the spectroradiometer (for example, CL-500A produced by KONICA MINOLTA, INC.) used to measure a light source color.

In this case, a relative emission intensity in the center wavelength of the first peak P1 is higher than a relative emission intensity in the center wavelength of the second peak P2, and a relative emission intensity in the center wavelength of the third peak P3 is lower than the relative emission intensity in the center wavelength of the second peak P2. In other words, in the specification, of the peaks of the emission spectrum S of light from the LED chips 21, the peak having the highest relative emission intensity is referred to as first peak P1, the peak having the second highest relative emission intensity is referred to as second peak P2, and the peak having the third highest relative emission intensity is referred to as third peak P3. Light from the LED chips 21 may include four or more peaks. When the emission spectrum S of light from the LED chips 21 has the above-described first peak P1, second peak P2, and third peak P3, light from the LED chips 21 becomes white, and the light source color of the LED chips 21 can be set to the incandescent or the warm white.

Here, components of light from the LED chips 21 can be derived by using the above-described emission spectrum S. In this case, components of light can be derived by analysis using waveform separation software (for example, "fityk"). At this time, initially, the emission spectrum S of light is imported with the waveform separation software. Subsequently, in the waveform separation software, the peaks (for example, the first peak P1, the second peak P2, and the third peak P3) of the imported emission spectrum S are selected. After that, the emission spectrum of the measured light is subjected to fitting by using Voigt function. Thus, the components of light are derived. In this case, the components of light may be derived by repeatedly performing fitting until a minimum squared error in the height direction of the waveform becomes lower than or equal to 1% between the waveform after fitting and the waveform of the emission spectrum.

As shown in FIG. 10, in the present embodiment, light from the LED chips 21 has a first component C1 (see the dashed line in FIG. 10) with a center wavelength of greater than or equal to 610 nm and less than or equal to 630 nm and a half width of greater than or equal to 90 nm and less than or equal to 110 nm, a second component C2 (see the alternate long and short dashed line in FIG. 10) with a center wavelength of greater than or equal to 440 nm and less than or equal to 460 nm and a half width of greater than or equal to 10 nm and less than or equal to 20 nm, and a third component C3 (see the alternate long and two-short dashed line in FIG. 10) with a center wavelength of greater than or equal to 510 nm and less than or equal to 530 nm and a half width of greater than or equal to 50 nm and less than or equal to 60 nm. In this case, a relative emission intensity in the center wavelength of the first component C1 is higher than a relative emission intensity in the center wavelength of the second component C2, and a relative emission intensity in the center wavelength of the third component C3 is lower than the relative emission intensity in the center wavelength of the second component C2. In other words, in the specification, of light from the LED chips 21, the component having the highest relative emission intensity is referred to as first component C1, the component having the second highest relative emission intensity is referred to as second component C2, and the component having the third highest relative emission intensity is referred to as third component C3. Light from the LED chips 21 may include four or more components. When light from the LED chips 21 has the above-described first component C1, second component C2, and third component C3, light from the LED chips 21 becomes white, and the light source color of the LED chips 21 can be set to the incandescent or the warm white.

In this case, a relative emission intensity in the center wavelength of the second component C2 is higher than or equal to 0.5 times and lower than or equal to 0.7 times a relative emission intensity in the center wavelength of the first component C1, and a relative emission intensity in the center wavelength of the third component C3 is higher than or equal to 0.3 times and lower than or equal to 0.5 times the relative emission intensity in the center wavelength of the first component C1. With this configuration, the light source color of the LED chips 21 can be set to the incandescent or the warm white. In this way, since the light source color of the LED chips 21 can be set to the incandescent or the warm white, which is presumably better in the quantum efficiency of photosynthesis as compared to the neutral white, the growth of plant bodies can be accelerated.

As shown in FIG. 11, in the present embodiment, a chromaticity of light from the LED chips 21 falls within a rectangular region (the shaded part in FIG. 11) connecting four sets of chromaticity coordinates (0.39, 0.36), (0.41, 0.44), (0.46, 0.44), and (0.42, 0.36) in an xy chromaticity diagram. In this case, light from the LED chips 21 becomes white, and, as shown in FIG. 11, the color temperature of light from the LED chips 21 is higher than or equal to about 2,900K and lower than or equal to about 3,600K. With this configuration, the growth of plants is accelerated, with the result that the growth rate of plants can be increased, and the number of growth days can be reduced. Therefore, the yield of plants in the plant growth factory 90 is improved. The chromaticity of light from the LED chips 21 can be measured similarly to the light source color with the spectroradiometer (for example, CL-500A produced by KONICA MINOLTA, INC.) used to measure a light source color.

In this way, according to the present embodiment, the light source color of each of the LED chips 21 is the incandescent or the warm white, of the light source colors defined in JISZ9112. With this configuration, the growth of plants is accelerated, with the result that the growth rate of plants can be increased, and the number of growth days can be reduced. In other words, since the light source color of the LED chips 21 is the incandescent or the warm white, which is presumably better in the quantum efficiency of photosynthesis than the neutral white, the growth of plant bodies can be accelerated. As a result, the yield of plants in the plant growth factory 90 is improved.

According to the present embodiment, the light source color of each of the LED chips 21 is the incandescent, of the light source colors defined in JISZ9112. With this configuration, the eyes of workers who work in the plant growth factory 90 do not get tired easily, so the working efficiency is improved.

According to the present embodiment, an emission spectrum S of light from the LED chips 21 has a first peak P1 with a center wavelength of greater than or equal to 610 nm and less than or equal to 630 nm, a second peak P2 with a center wavelength of greater than or equal to 440 nm and less than or equal to 460 nm, and a third peak P3 with a center wavelength of greater than or equal to 510 nm and less than or equal to 530 nm. A relative emission intensity in the center wavelength of the first peak P1 is higher than a relative emission intensity in the center wavelength of the second peak P2, and a relative emission intensity in the center wavelength of the third peak P3 is lower than the relative emission intensity in the center wavelength of the second peak P2. With this configuration, light from the LED chips 21 becomes white, and the light source color of the LED chips 21 can be set to the incandescent or the warm white. Therefore, the above-described advantageous effects are obtained.

According to the present embodiment, light from the LED chips 21 has a first component C1 with a center wavelength of greater than or equal to 610 nm and less than or equal to 630 nm and a half width of greater than or equal to 90 nm and less than or equal to 110 nm, a second component C2 with a center wavelength of greater than or equal to 440 nm and less than or equal to 460 nm and a half width of greater than or equal to 10 nm and less than or equal to 20 nm, and a third component C3 with a center wavelength of greater than or equal to 510 nm and less than or equal to 530 nm and a half width of greater than or equal to 50 nm and less than or equal to 60 nm. A relative emission intensity in the center wavelength of the first component C1 is higher than a relative emission intensity in the center wavelength of the second component C2, and a relative emission intensity in the center wavelength of the third component C3 is lower than the relative emission intensity in the center wavelength of the second component C2. With this configuration, light from the LED chips 21 becomes white, and the light source color of the LED chips 21 can be set to the incandescent or the warm white. Therefore, the above-described advantageous effects are obtained.

According to the present embodiment, a relative emission intensity in the center wavelength of the second component C2 is higher than or equal to 0.5 times and lower than or equal to 0.7 times a relative emission intensity in the center wavelength of the first component C1, and a relative emission intensity in the center wavelength of the third component C3 is higher than or equal to 0.3 times and lower than or equal to 0.5 times the relative emission intensity in the center wavelength of the first component C1. With this configuration, the light source color of the LED chips 21 can be set to the incandescent or the warm white. In this way, since the light source color of the LED chips 21 can be set to the incandescent or the warm white, which is presumably better in the quantum efficiency of photosynthesis as compared to the neutral white, the growth of plant bodies can be accelerated.

According to the present embodiment, a chromaticity of light from the LED chips 21 falls within a rectangular region connecting four sets of chromaticity coordinates (0.39, 0.36), (0.41, 0.44), (0.46, 0.44), and (0.42, 0.36) in an xy chromaticity diagram. In this case, light from the LED chips 21 becomes white, and the color temperature of light from the LED chips 21 is higher than or equal to about 2,900K and lower than or equal to about 3,600K. With this configuration, the growth of plants is accelerated, with the result that the growth rate of plants can be increased, and the number of growth days can be reduced. Therefore, the yield of plants in the plant growth factory 90 is improved.

According to the present embodiment, the 10 or more LED chips 21 are arranged in series, and four or more rows of the LED chips 21 are arranged in parallel. With this configuration, the LED chips 21 are equally placed in the plane, and arrays of the LED chips 21 are placed in parallel, so the risk at the time of a break of one or some of the LED chips 21 can be dispersed.

According to the present embodiment, the LED chips 21 are covered with the transparent protective film 35, so the LED chips 21 are protected from moisture that spatters during growth of plants.

According to the present embodiment, since the thickness of the thickest part in the LED lighting sheet 20 is less than or equal to 5 mm, the yield of plants per unit area can be increased by reducing the distance between the upper and lower boards 81 of the plant growth rack 80 and increasing the number of the boards 81.

According to the present embodiment, the controller 40 is externally connected to the LED lighting sheet 20, so it is possible to eliminate the influence of heat from the controller 40 on plants by placing the controller 40 away from the LED lighting sheet 20.

According to the present embodiment, a constant voltage is applied from the controller 40 to the LED lighting sheet 20, so the growth of plants can be accelerated by increasing the accumulated amount of light per unit time from the LED chips 21.

According to the present embodiment, the controller 40 is capable of controlling the lighting of the LED chips 21, so the intensity of light from the LED chips 21 can be adjusted according to a growth stage of plants.

In the above-described present embodiment, the case where the LED lighting unit is a surface light source sheet is described; however, the configuration is not limited thereto. Although not shown in the drawing, for example, the LED lighting unit may be a straight-tube lighting unit.

Examples

Next, specific examples of the present embodiment will be described.

(Preparation of LED Lighting Sheet)

LED lighting sheets of Example 4, Example 5, and Comparative Example 3 were prepared as follows.

Example 4

Copper foil (thickness 35 μm) for forming a metal wiring portion was laminated on one of the surfaces of a 560 mm×390 mm film substrate (polyethylene naphthalate, thickness 50 μm), and then the copper foil for metal wires was subjected to etching to form the metal wiring portion with the same pattern in all the examples and comparative examples. Then, a light reflection insulating protective film with a thickness of 10 μm was formed on the substrate film and the metal wiring portion by screen printing using electrically insulating ink made up of a urethane resin as a base resin and 20 percent by mass of titanium oxide added to the base resin. Subsequently, a plurality of LED chips ("NFSW757G-V2" (produced by NICHIA Corporation)) was implemented on the metal wiring portion in a matrix of 14 rows by 10 columns by soldering at a pitch of 40 mm in the X direction and at a pitch of 35 mm in the Y direction. The LED chips were top emission-type light-emitting elements and had a rectangular parallelepiped outer shape with a size of 3.0 mm (length)×3.0 mm (width)×0.65 mm (height). The light source color of each of the LED chips was the incandescent, and the color temperature of each light source color was 3000K. Furthermore a transparent protective film that covers the electrically insulating protective film and the LED chips was formed by spray coating. The LED lighting sheet prepared as described above was used as the LED lighting sheet of Example 4.

Example 5

The LED lighting sheet prepared similarly to Example 4 was used as the LED lighting sheet of Example 5 except that LED chips ("NFSW757G-V2" (produced by NICHIA Corporation)) of which the light source color was the warm white and the color temperature was 3500K were used.

Comparative Example 3

The LED lighting sheet prepared similarly to Example 4 was used as the LED lighting sheet of Comparative Example 3 except that LED chips ("NFSW757G-V2" (produced by NICHIA Corporation)) of which the light source color was the neutral white and the color temperature was 5000K were used.

For the LED chips used in the LED lighting sheets of Example 4, Example 5, and Comparative Example 3, the optical characteristics, specifically, the emission spectrum, was measured. The emission spectrum of light was measured with a spectroradiometer (CL-500A produced by KONICA MINOLTA, INC.). The measured emission spectrum each had a first peak, a second peak, and a third peak, and the center wavelength of each of the first peak, the second peak, and the third peak was measured.

For the LED chips used in the LED lighting sheets of Example 4, Example 5, and Comparative Example 3, the components of light were derived from the emission spectrum by using waveform separation software (for example, "fityk"). At this time, initially, the measured emission spectrum of light was imported, and the first peak, the second peak, and the third peak were selected. After that, the emission spectrum of the measured light was subjected to fitting by using Voigt function. Then, the first component, the second component, and the third component of light were derived by repeatedly performing fitting until an error in the height direction of the waveform becomes lower than or equal to 1% between the waveform after fitting and the waveform of the emission spectrum. After that, the center wavelength and half width of each of the derived first component, second component, and third component were measured.

Subsequently, the LED lighting sheets of Example 4, Example 5, and Comparative Example 3 each were attached to a plant growth rack, and plants (baby spinach) were actually cultivated. After that, the fresh weights (g/m$^2$) of plants grown were measured. The fresh weights were measured by measuring above-ground part fresh weight after completion of cultivation for each cultivation panel and calculating a weight per square meter. A fresh weight per day (g/m$^2$/day) that was a fresh weight per cultivation days was calculated. The above evaluation results are shown in Table 3.

TABLE 3

| | EXAMPLE 4 | EXAMPLE 5 | COMPARATIVE EXAMPLE 3 |
|---|---|---|---|
| LIGHT SOURCE COLOR | INCANDESCENT | WARM WHITE | NEUTRAL WHITE |
| COLOR TEMPERATURE (K) | 3000 | 3500 | 5000 |
| FIRST COMPONENT CENTER WAVELENGTH (nm) | 614.0 | 615.0 | 450.6 |
| FIRST COMPONENT HALF WIDTH (nm) | 110.9 | 107.0 | 21.1 |
| SECOND COMPONENT CENTER WAVELENGTH (nm) | 453.7 | 455 | 522.5 |
| SECOND COMPONENT HALF WIDTH (nm) | 22.0 | 15.9 | 68.0 |
| THIRD COMPONENT CENTER WAVELENGTH (nm) | 515.8 | 520.0 | 618.8 |
| THIRD COMPONENT HALF WIDTH (nm) | 59.9 | 57.7 | 124.2 |
| TOTAL INPUT POWER (W) | 180 | 180 | 180 |
| CULTIVATION DAYS (DAYS) | 11 | 11 | 11 |
| FRESH WEIGHT (g/m$^2$) | 2100 | 2045 | 1925 |
| FRESH WEIGHT PER DAY (g/m$^2$/day) | 191 | 186 | 175 |
| | (109%) | (106%) | (100%) |

As shown in Table 3, when the LED lighting sheets of Example 4 and Example 5 were used, the fresh weight of plants was increased as compared to the case where the LED lighting sheet of Comparative Example 3 was used. Specifically, when the LED lighting sheet (the light source color of the LED chips was the incandescent) of Example 4 was used, the fresh weight per day (g/m$^2$/day) was increased by about 9% as compared to the case where the LED lighting sheet (the light source color of the LED chips was the neutral white) of Comparative Example 3 was used. When the LED lighting sheet (the light source color of the LED chips was the warm white) of Example 5 was used, the fresh weight per day (g/m$^2$/day) was increased by about 6% as compared to the case where the LED lighting sheet (the light source color of the LED chips was the neutral white) of Comparative Example 3 was used. In this way, when the LED lighting sheets of Example 4 and Example 5 were used, the productivity of plants was improved by setting the light source color of the LED chips to the incandescent or the warm white.

Third Embodiment

An LED lighting sheet for animal/plant growth according to a third embodiment includes a substrate film, a metal wiring portion formed on a surface of the substrate film, an LED chip implemented on the metal wiring portion, and a protective portion that at least partially covers a side of the LED chip and protects the LED chip.

The LED lighting sheet for animal/plant growth according to the present embodiment is a sheet LED lighting unit, so the overall thickness is reduced as compared to an LED bar light including an array of straight-tube LEDs. Therefore, a vertical space between shelves of an animal/plant growth rack can be reduced to improve the floor area yield of an animal/plant growth factory for animals and/or plants grown. Because the thickness of the LED chips is less than the thickness of the LED straight tubes, the LED lighting sheet reduces a difference in height between a region where the LED chips are placed and a region where the LED chips are not placed as compared to a difference in height between a region where the LED straight tubes are placed and a region where the LED straight tubes are not placed. Therefore, a shadow hardly appears to the side of each LED chip, so variations of light irradiated to animals and/or plants are reduced even when the animals and/or plants grow up and get close to the LED lighting sheet. In the LED lighting unit for animal/plant growth, a reduction of variations of light irradiated to animals and/or plants leads to a reduction of nonconforming products by setting the size and quality of animals and/or plants grown within the range of certain specifications, so it is important. In growing animals and/or plants, control over light and heat irradiated to animals and/or plants during a late growth stage in which animals and/or plants grow up and photosynthesis becomes active is important. The LED lighting sheet for animal/plant growth according to the present embodiment is capable of reducing variations of relatively strong light irradiated to animals and/or plants when the animals and/or plants are close to the LED lighting sheet.

In the LED lighting sheet for animal/plant growth according to the present embodiment, the protective portion at least partially covers the side of the LED chip and protects the LED chip. With this configuration, even when a worker touches the LED chip, peeling of the LED chips off from the LED lighting sheet is reduced. Therefore, a drop of the LED chip onto plants grown is reduced, and a touch of a fluorescent material of the LED chip with plants is reduced. Hence, good hygiene of plants grown is kept.

An LED lighting module for animal/plant growth according to the present embodiment includes an LED lighting sheet for animal/plant growth, and a controller electrically connected to the LED lighting sheet, and the controller is externally connected to the LED lighting sheet.

Since the LED lighting module for animal/plant growth according to the present embodiment includes the external controller, the growth rate of animals and/or plants grown can be increased while a decrease in the yield of animals and/or plants grown is suppressed, with the result that animals and/or plants are obtained with a high yield. Heat that is locally generated around the controller has a strong effect on animals and/or plants grown near the controller and has a small effect on animals and/or plants grown far from the controller. Therefore, variations occur in growth conditions of animals and/or plants and lead to many nonconforming products, with the result that the yield may decrease. When the amount of light of the LED lighting sheet increases, heat generated from the controller increases. With the LED lighting module in which the controller is externally connected to the LED lighting sheet externally, the controller can be installed at any location, so the variations are reduced, and a high yield is obtained.

A shelf for an animal/plant growth rack, an animal/plant growth rack, and an animal/plant growth factory according to the present embodiment each include the LED lighting sheet or module for animal/plant growth according to the present embodiment, so animals and/or plants are obtained with a high yield.

Next, the third embodiment will be described with reference to FIG. 12 to FIG. 22. The third embodiment shown in FIG. 12 to FIG. 22 mainly differs from the first embodiment in that the LED lighting sheet for animal/plant growth includes a protective portion that at least partially covers a side of the LED chip and protects the LED chip. In FIG. 12 to FIG. 22, like reference signs are assigned to the same portions as those of the first embodiment or the same portions as those of the second embodiment, and the detailed description is omitted.

Figure 12:
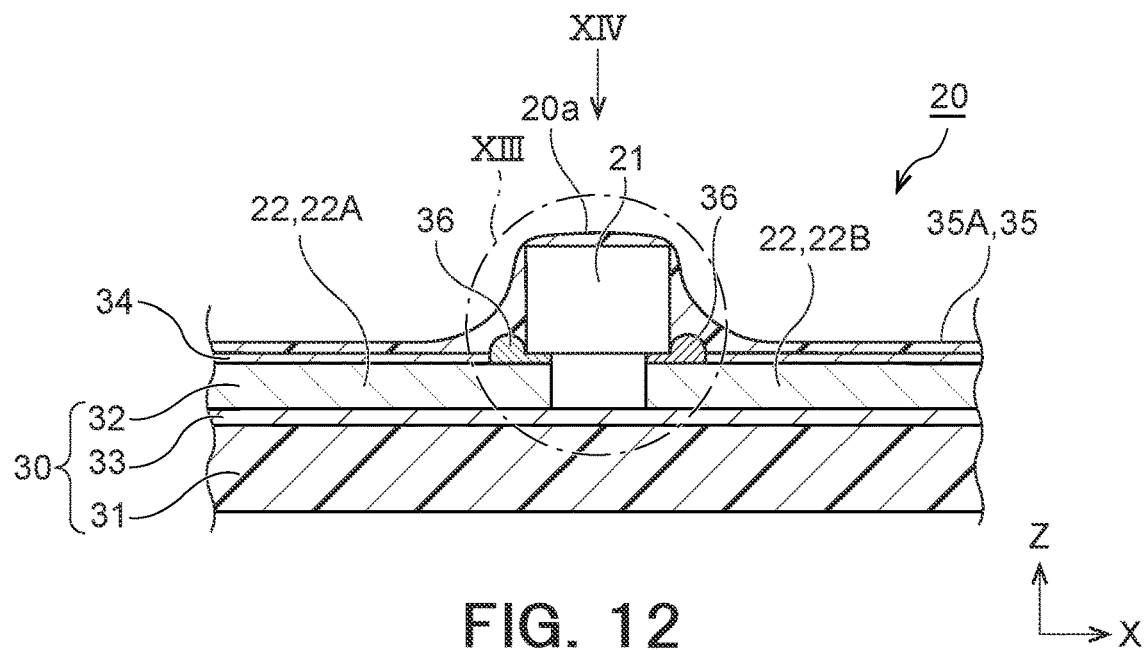
FIG. 12 is a sectional view showing an LED lighting sheet according to a third embodiment and corresponding to FIG. 5.

As shown in FIG. 12, in the present embodiment, a protective portion 35A that covers the light reflection insulating protective film 34 and the LED chips 21 and protects the LED chips 21 is provided. The protective portion 35A has the transparent protective film 35.

As described above, the solder portions 36 join the metal wiring portion 32 with each LED chip 21. Joining with solder may be performed with a reflow method. As shown in FIG. 12, the solder portions 36 according to the present embodiment extend from a back side 21c of the LED chip 21 to a side 21b of the LED chip 21. In a cross section perpendicular to the light emitting surface 20a of the LED lighting sheet 20, a part of the solder portion 36, located laterally to the LED chip 21, has a curved shape bowed toward the light emitting surface 20a. In the present embodiment, a part of the solder portion 36, located laterally to the LED chip 21, is formed in substantially a semicircular shape in the cross section perpendicular to the light emitting surface 20a of the LED lighting sheet 20. The phrase "cross section perpendicular to the light emitting surface of the LED lighting sheet" in the specification means a cross section along a direction (Z direction) perpendicular to the first array direction (X direction) and the second array direction (Y direction).

Figure 13:
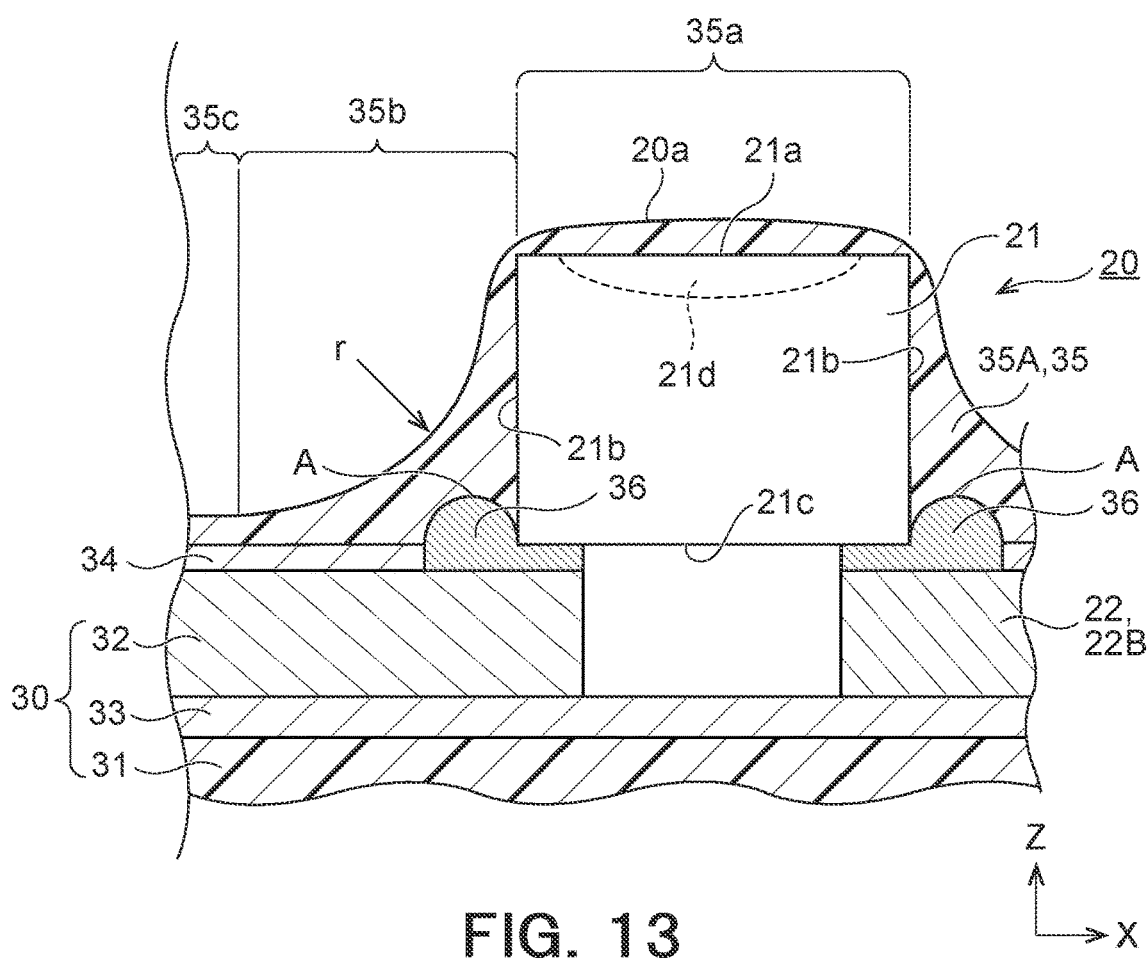
FIG. 13 is an enlarged view (enlarged view corresponding to portion XIII in FIG. 12) showing a protective portion of the LED lighting sheet according to the third embodiment.

As shown in FIG. 12 and FIG. 13, in the cross section perpendicular to the light emitting surface 20a of the LED lighting sheet 20, a part A of which the thickness is thickest in the solder portion 36 is not in contact with the side 21b of the LED chip 21. With this configuration, as shown in FIG. 13, the transparent protective film 35 is interposed between the side 21b of the LED chip 21 and the solder portion 36. Therefore, the adhesion between the transparent protective film 35 and the LED chip 21 is improved. As a result, the transparent protective film 35 is capable of effectively protecting the LED chip 21. Since the transparent protective film 35 is interposed between the side 21b of the LED chip 21 and the solder portion 36, even when a worker touches the LED chip 21, the transparent protective film 35 is capable of absorbing force applied to the LED chip 21, with the result that peeling of the LED chip 21 off from the LED lighting sheet 20 is effectively suppressed.

Figure 14:
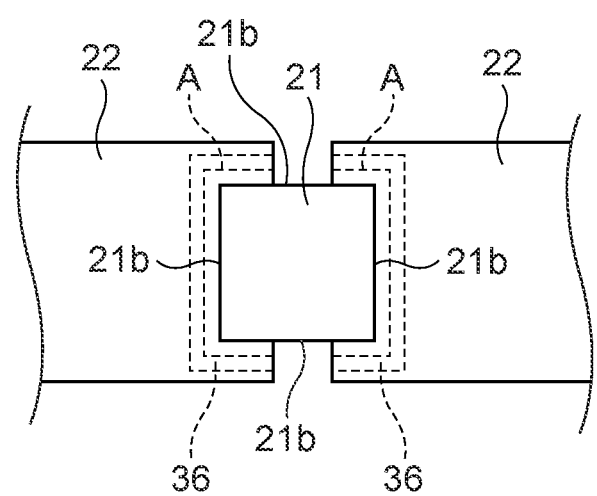
FIG. 14 is a plan view (arrow view taken in the XIV direction in FIG. 12) showing an LED chip of the LED lighting sheet according to the third embodiment.

As shown in FIG. 14, when viewed from the light emitting surface 20a side, a part of the solder portion 36, located laterally to the LED chip 21, is formed so as to partially surround the side 21b of the LED chip 21. With this configuration, the bonding strength between the LED chip 21 and the solder portion 36 is improved. Therefore, peeling of the LED chip 21 off from the solder portion 36 is reduced.

On the other hand, as shown in FIG. 13, a part of the solder portion 36, located on the back side 21c of the LED chip 21, extends continuously on the metal wiring portion 32. As will be described later, such a shape of the solder portion 36 is formed in a manner such that, when the solder portion 36 is formed with a reflow method, solder 36a (see FIG. 15G to FIG. 15H) is pressed flat by the LED chip 21. Although not shown in the drawing, a part of the solder portion 36, located on the back side 21c of the LED chip 21, may be made up of a plurality of parts spaced apart from each other. In other words, a region where no solder portion 36 is formed may be present on the back side 21c of the LED chip 21. As described above, when the solder portion 36 is formed, the solder 36a is pressed flat by the LED chip 21. Thus, the solder 36a can be pushed out from the back side 21c of the LED chip 21, and a region where no solder portion 36 is formed can be formed on the back side 21c of the LED chip 21. Joining with solder may be performed with a laser method.

Next, the transparent protective film 35 according to the present embodiment will be described in more details with reference to FIG. 13. As shown in FIG. 13, the transparent protective film 35 according to the present embodiment covers the entire region of a front side (a surface of the light emitting surface 20a side) 21a and the side 21b of the LED chip 21. In this case, the transparent protective film 35 has a center part 35a that covers the front side 21a of the LED chip 21, a curved part 35b that is formed around the center part 35a and covers the side 21b of the LED chip 21, and a flat part 35c formed contiguously to the curved part 35b. Of these parts, the center part 35a covers the entire region of the front side 21a of the LED chip 21. With this configuration, a fluorescent material 21d that can be placed at substantially the center of the front side 21a of the LED chip 21 is reliably protected from moisture that spatters during growth of plants. Since the center part 35a covers the entire region of the front side 21a of the LED chip 21, when the LED lighting sheet 20 is used in a plant growth factory, a touch of grown plants with the fluorescent material 21d is reduced. In addition, since the center part 35a covers the entire region of the front side 21a of the LED chip 21, a drop of the fluorescent material 21d of the LED chip 21 onto plants grown is reduced, so a touch of the fluorescent material 21d with plants is reduced. Hence, good hygiene of plants grown is kept.

The thickness of the center part 35a is formed so as to gradually increase toward the center of the LED chip 21 on the front side 21a of the LED chip 21. With this configuration, the thickness of a part of the center part 35a, covering the fluorescent material 21d that can be placed substantially at the center of the front side 21a of the LED chip 21, is increased. Therefore, the fluorescent material 21d that can be placed at substantially the center of the front side 21a of the LED chip 21 is further reliably protected from moisture that spatters during growth of plants.

In the present embodiment, the thickness of the part of which the thickness is thickest in the center part 35a of the transparent protective film 35 is greater than or equal to 5 µm and less than or equal to 40 µm, preferably greater than or equal to 15 µm and less than or equal to 30 µm, and more preferably greater than or equal to 20 µm and less than or equal to 25 µm. When the thickness of the part of which the thickness is thickest in the center part 35a is less than or equal to 40 µm, the good flexibility and thinness, lightweight properties, and good optical characteristics desired for plant growth application, of the LED lighting sheet 20 are effectively maintained. When the thickness of the part of which the thickness is thickest in the center part 35a is greater than or equal to 10 µm, sufficient waterproofness desired for plant growth application is obtained for the LED lighting sheet 20.

The curved part 35b of the transparent protective film 35 covers the entire region of the side 21b of the LED chip 21. With this configuration, even when a worker touches the LED chip 21, peeling of the LED chip 21 off from the solder portion 36 is reduced.

The thickness of the curved part 35b is formed so as to gradually increase with approach to the LED chip 21. With this configuration, even when a worker touches the LED chip 21, local application of large force to the joint between the LED chip 21 and the solder portion 36 is reduced, so peeling of the LED chip 21 off from the solder portion 36 is further effectively reduced.

The curved part 35b has a concave shape that is recessed from the light emitting surface 20a side toward the side opposite from the light emitting surface 20a in the cross section perpendicular to the light emitting surface 20a of the LED lighting sheet 20. With this configuration, even when a worker touches the LED chip 21, a break of the transparent protective film 35 due to force applied to the LED chip 21 is effectively reduced. In this case, the radius of curvature r of the concave shape may be, for example, greater than or equal to about 200 µm and less than or equal to about 5000 µm.

The curved part 35b covers the solder portion 36 located laterally to the LED chip 21. With this configuration, the solder portion 36 is protected from moisture that spatters during growth of plants. Since the solder portion 36 is covered with the curved part 35b of the transparent protective film 35, a touch of grown plants with the solder portion 36 is reduced. In addition, since the solder portion 36 is covered with the curved part 35b, peeling of the solder portion 36 off from the LED chip 21 is reduced. Particularly, in the present embodiment, a part of the solder portion 36, located laterally to the LED chip 21, is formed in substantially a semicircular shape. With this configuration, the joint region between the part of the solder portion 36, located laterally to the LED chip 21, and the side 21b of the LED chip 21 can reduce. Therefore, the joint strength between the part of the solder portion 36, located laterally to the LED chip 21, and the side 21b of the LED chip 21 may decrease. In the present embodiment, since the solder portion 36 is covered with the curved part 35b of the transparent protective film 35, even when a part of the solder portion 36, located laterally to the LED chip 21, is formed in substantially a semicircular shape, peeling of the solder portion 36 off from the LED chip 21 is effectively reduced. Thus, a touch of solder with plants is reduced. Hence, good hygiene of plants grown is kept.

The flat part 35c of the transparent protective film 35 has substantially a constant thickness. The thickness of the flat part 35c is greater than or equal to 5 µm and less than or equal to 40 µm, preferably greater than or equal to 15 µm and less than or equal to 30 µm, and more preferably greater than or equal to 20 µm and less than or equal to 25 µm. When the thickness of the flat part 35c is less than or equal to 40 µm, good flexibility and thinness and lightweight properties of the LED lighting sheet 20 are effectively maintained. When the thickness of the flat part 35c is greater than or equal to 5 µm, sufficient waterproofness desired for plant growth application is obtained for the LED lighting sheet 20.

The surface of the transparent protective film 35 may be hydrophilic. With this configuration, when water adheres to the transparent protective film 35, the adherent water is distributed so as to spread along the surface of the transparent protective film 35. Therefore, it is possible to reduce adherent water remaining at locations corresponding to the fluorescent material 21d on the front side 21a of the LED chips 21 as liquid droplets. As a result, the high optical characteristics of the LED lighting sheet 20 are effectively maintained.

(Manufacturing Method for LED Lighting Sheet)

Next, a manufacturing method for the LED lighting sheet 20 according to the present embodiment will be described with reference to FIG. 15A to FIG. 15I.

Figure 15A:
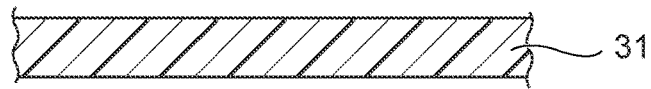
FIG. 15A is sectional view showing a manufacturing method for the LED lighting sheet according to the third embodiment.
Figure 15B:
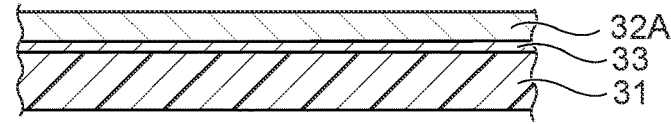
FIG. 15B is sectional view showing a manufacturing method for the LED lighting sheet according to the third embodiment.

Initially, the substrate film 31 is prepared (FIG. 15A). Subsequently, metal foil 32A, such as copper foil, which is the material of the metal wiring portion 32, is laminated on the surface of the substrate film 31 (FIG. 15B).

Figure 15C:
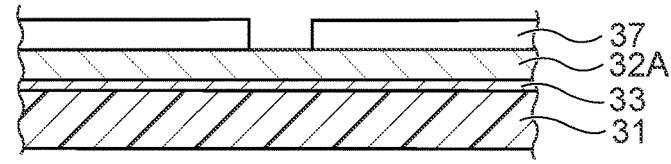
FIG. 15C is sectional view showing a manufacturing method for the LED lighting sheet according to the third embodiment.

After that, an etching mask 37 patterned in a shape required for the metal wiring portion 32 is formed on the surface of the metal foil 32A (FIG. 15C).

Figure 15D:
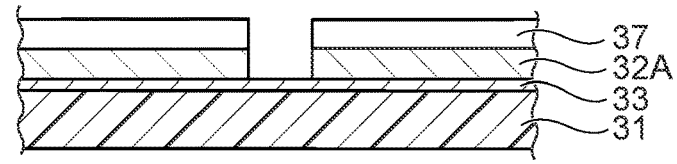
FIG. 15D is sectional view showing a manufacturing method for the LED lighting sheet according to the third embodiment.

Subsequently, the metal foil 32A at locations not covered with the etching mask 37 is removed by immersion liquid (FIG. 15D).

Figure 15E:
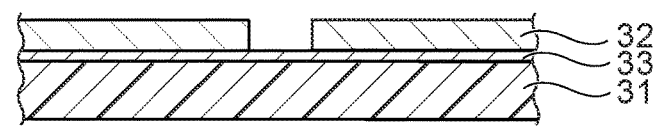
FIG. 15E is sectional view showing a manufacturing method for the LED lighting sheet according to the third embodiment.

After that, the etching mask 37 is removed by using alkaline stripper to remove the etching mask 37. As a result, the etching mask 37 is removed from the surface of the metal wiring portion 32 (FIG. 15E).

Figure 15F:
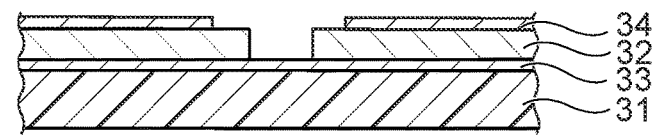
FIG. 15F is sectional view showing a manufacturing method for the LED lighting sheet according to the third embodiment.

Subsequently, the light reflection insulating protective film 34 is laminated on the metal wiring portion (FIG. 15F).

Figure 15G:
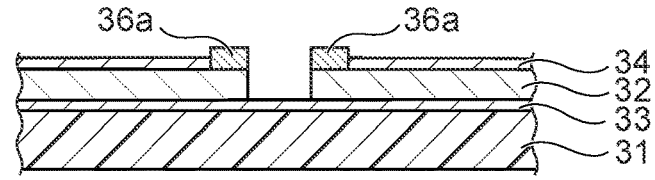
FIG. 15G is sectional view showing a manufacturing method for the LED lighting sheet according to the third embodiment.
Figure 15H:
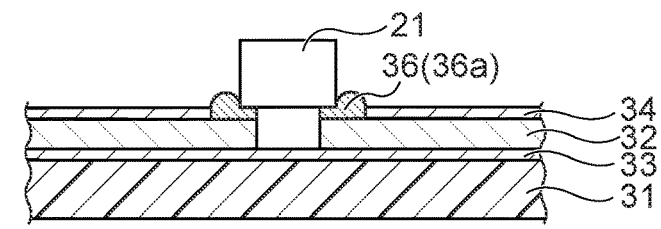
FIG. 15H is sectional view showing a manufacturing method for the LED lighting sheet according to the third embodiment.
Figure 15I:
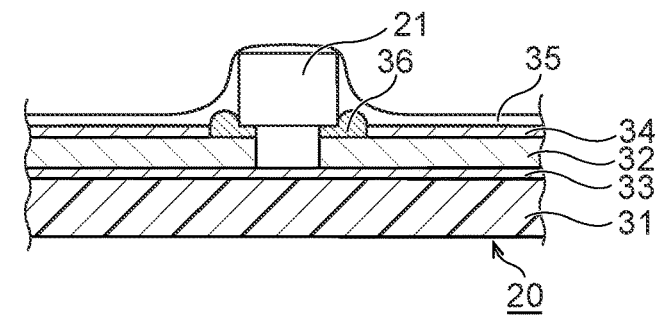
FIG. 15I is sectional view showing a manufacturing method for the LED lighting sheet according to the third embodiment.

After that, parts such as the LED chips 21 and the regulators 45, and the connectors 44 are implemented on the metal wiring portion 32 (FIG. 15G and FIG. 15H). In FIG. 15H and FIG. 15I (described later), the parts of the regulators 45 are not shown for clear illustration. In this case, each LED chip 21 is joined with the metal wiring portion 32 via the solder portions 36 by soldering. At this time, initially, the solder 36a is laminated on the metal wiring portion 32 (FIG. 15G). Subsequently, each LED chip 21 is placed on the solder 36a (FIG. 15H). With this configuration, the solder 36a is pressed flat by the LED chip 21, and the solder 36a is formed so as to extend from the back side 21c of the LED chip 21 to the side 21b of the LED chip 21. Subsequently, by heating the solder 36a in a reflow furnace (not shown), each of the LED chips 21 is implemented on the metal wiring portion 32 via the solder portion 36. In this case, a part of the solder portion 36, located laterally to the LED chip 21, is formed in substantially a semicircular shape. Joining by soldering may be performed by a laser method or joining with a conductive resin.

Subsequently, the transparent protective film 35 is formed so as to cover the light reflection insulating protective film 34, parts such as the LED chips 21 and the regulators 45, and the connectors 44 (FIG. 15I). The transparent protective film 35 is preferably formed by spray coating or curtain coating. Formation of the transparent protective film 35 by spray coating can be performed in a manner such that, for example, a coating film is formed by spraying coating liquid containing acrylic polyurethane resin to a desired region on the flexible wiring substrate 30 with a spray coater. Formation of the transparent protective film 35 by curtain coating can be performed in a manner such that, for example, a coating film is formed by dripping curtain coating liquid containing acrylic polyurethane resin to a desired region on the flexible wiring substrate 30 with a curtain coater. In these cases, the thickness of the transparent protective film 35 can be held within a predetermined range, and the shape of the transparent protective film 35 can be caused to easily follow the shape of the LED chip 21. At this time, by adjusting conditions of spray coating or curtain coating as needed, the transparent protective film 35 having the center part 35a, the curved part 35b, and the flat part 35c is formed (see FIG. 13).

Not limited to the above-described methods, the LED lighting sheet 20 according to the present embodiment can also be manufactured by known methods of manufacturing an existing known flexible wiring substrate for LED chips or various LED modules formed by implementing LED chips on the flexible wiring substrate.

In this way, according to the present embodiment, the LED lighting sheet 20 includes the protective portion 35A that covers the side 21b of the LED chip 21 and protects the LED chip 21. With this configuration, even when a worker touches the LED chip 21, peeling of the LED chip 21 off from the LED lighting sheet 20 is reduced. Therefore, a drop of the LED chip 21 onto plants grown is reduced, and a touch of a fluorescent material 21d of the LED chip 21 with plants is reduced. Hence, good hygiene of plants grown is kept.

According to the present embodiment, the protective portion 35A covers the solder portion 36 located laterally to the LED chip 21. With this configuration, the solder portion 36 is protected from moisture that spatters during growth of plants, so a short-circuit of the solder portion 36 due to moisture is reduced. Since the solder portion 36 is covered with the protective portion 35A, a touch of grown plants with the solder portion 36 is reduced. In addition, since the solder portion 36 is covered with the protective portion 35A, peeling of the solder portion 36 off from the LED chip 21 is reduced. Particularly, in the present embodiment, a part of the solder portion 36, located laterally to the LED chip 21, is formed in substantially a semicircular shape. With this configuration, the joint strength between the part of the solder portion 36, located laterally to the LED chip 21, and the side 21b of the LED chip 21 may decrease. In the present embodiment, since the solder portion 36 is covered with the transparent protective film 35, even when a part of the solder portion 36, located laterally to the LED chip 21, is formed in substantially a semicircular shape, peeling of the solder portion 36 off from the LED chip 21 is effectively reduced. Thus, a touch of solder with plants is reduced. Hence, good hygiene of plants grown is kept.

According to the present embodiment, the center part 35a covers the entire region of the front side 21a of the LED chip 21. With this configuration, a fluorescent material 21d that can be placed at substantially the center of the front side 21a of the LED chip 21 is reliably protected from moisture that spatters during growth of plants. Since the center part 35a covers the entire region of the front side 21a of the LED chip 21, when the LED lighting sheet 20 is used in a plant growth factory, a touch of grown plants with the fluorescent material 21d is reduced. In addition, since the center part 35a covers the entire region of the front side 21a of the LED chip 21, a drop of the fluorescent material 21d of the LED chip 21 onto plants grown is reduced, so a touch of the fluorescent material 21d with plants is reduced. Hence, good hygiene of plants grown is kept.

According to the present embodiment, the thickness of the center part 35a is formed so as to gradually increase toward the center of the LED chip 21. With this configuration, the thickness of a part of the center part 35a, covering the fluorescent material 21d that can be placed substantially at the center of the front side 21a of the LED chip 21, is increased. Therefore, the fluorescent material 21d that can be placed at substantially the center of the front side 21a of the LED chip 21 is further reliably protected from moisture that spatters during growth of plants.

According to the present embodiment, the curved part 35b of the transparent protective film 35 covers the entire region of the side 21b of the LED chip 21. With this configuration, even when a worker touches the LED chip 21, peeling of the LED chip 21 off from the solder portion 36 is reduced.

According to the present embodiment, the thickness of the curved part 35b is formed so as to gradually increase with approach to the LED chip 21. With this configuration, even when a worker touches the LED chip 21, local application of large force to the joint between the LED chip 21 and the solder portion 36 is reduced, so peeling of the LED chip 21 off from the solder portion 36 is further effectively reduced.

According to the present embodiment, the curved part 35b has a concave shape that is recessed from the light emitting surface 20a side toward the side opposite from the light emitting surface 20a in the cross section perpendicular to the light emitting surface 20a of the LED lighting sheet 20. With this configuration, even when a worker touches the LED chip 21, a break of the transparent protective film 35 due to force applied to the LED chip 21 is effectively reduced.

According to the present embodiment, the curved part 35b covers the solder portion 36 located laterally to the LED chip 21. With this configuration, the solder portion 36 is protected from moisture that spatters during growth of plants. Since the solder portion 36 is covered with the curved part 35b, a touch of grown plants with the solder portion 36 is reduced. In addition, since the solder portion 36 is covered with the curved part 35b, peeling of the solder portion 36 off from the LED chip 21 is reduced. Therefore, a touch of solder with plants is reduced, so good hygiene of plants grown is kept.

According to the present embodiment, in the cross section perpendicular to the light emitting surface 20a of the LED lighting sheet 20, the part A of which the thickness is thickest in the solder portion 36 is not in contact with the side 21b of the LED chip 21. With this configuration, the transparent protective film 35 is interposed between the side 21b of the LED chip 21 and the solder portion 36, so the adhesion between the transparent protective film 35 and the LED chip 21 is improved. As a result, the transparent protective film 35 is capable of effectively protecting the LED chip 21. Since the transparent protective film 35 is interposed between the side 21b of the LED chip 21 and the solder portion 36, even when a worker touches the LED chip 21, the transparent protective film 35 is capable of absorbing force applied to the LED chip 21, with the result that peeling of the LED chip 21 off from the LED lighting sheet 20 is effectively suppressed.

According to the present embodiment, when viewed from the light emitting surface 20a side, a part of the solder portion 36, located laterally to the LED chip 21, is formed so as to partially surround the side 21b of the LED chip 21. With this configuration, the bonding strength between the LED chip 21 and the solder portion 36 is improved. Therefore, peeling of the LED chip 21 off from the solder portion 36 is reduced.

According to the present embodiment, the transparent protective film 35 covers the light reflection insulating protective film 34. As a result, the transparent protective film 35 is capable of protecting the light reflection insulating protective film 34.

According to the present embodiment, the protective portion 35A covers the entire region of the front side 21a and side 21b of the LED chip 21. With this configuration, the LED chip 21 is reliably protected from moisture that spatters during growth of plants. Since the protective portion 35A covers the entire region of the front side 21a of the LED chip 21, further good hygiene of plants grown is kept.

According to the present embodiment, the 10 or more LED chips 21 are arranged in series, and four or more rows of the LED chips 21 are arranged in parallel. With this configuration, the LED chips 21 are equally placed in the plane, and arrays of the LED chips 21 are placed in parallel, so the risk at the time of a break of one or some of the LED chips 21 can be dispersed.

According to the present embodiment, since the thickness of the thickest part in the LED lighting sheet 20 is less than or equal to 5 mm, the yield of plants per unit area can be increased by reducing the distance between the upper and lower boards 81 of the plant growth rack 80 and increasing the number of the boards 81.

According to the present embodiment, the controller 40 is externally connected to the LED lighting sheet 20, so it is possible to eliminate the influence of heat from the controller 40 on plants by placing the controller 40 away from the LED lighting sheet 20.

According to the present embodiment, a constant voltage is applied from the controller 40 to the LED lighting sheet 20, so the growth of plants can be accelerated by increasing the accumulated amount of light per unit time from the LED chips 21.

According to the present embodiment, the controller 40 is capable of controlling the lighting of the LED chips 21, so the intensity of light from the LED chips 21 can be adjusted according to a growth stage of plants.

Figure 16:
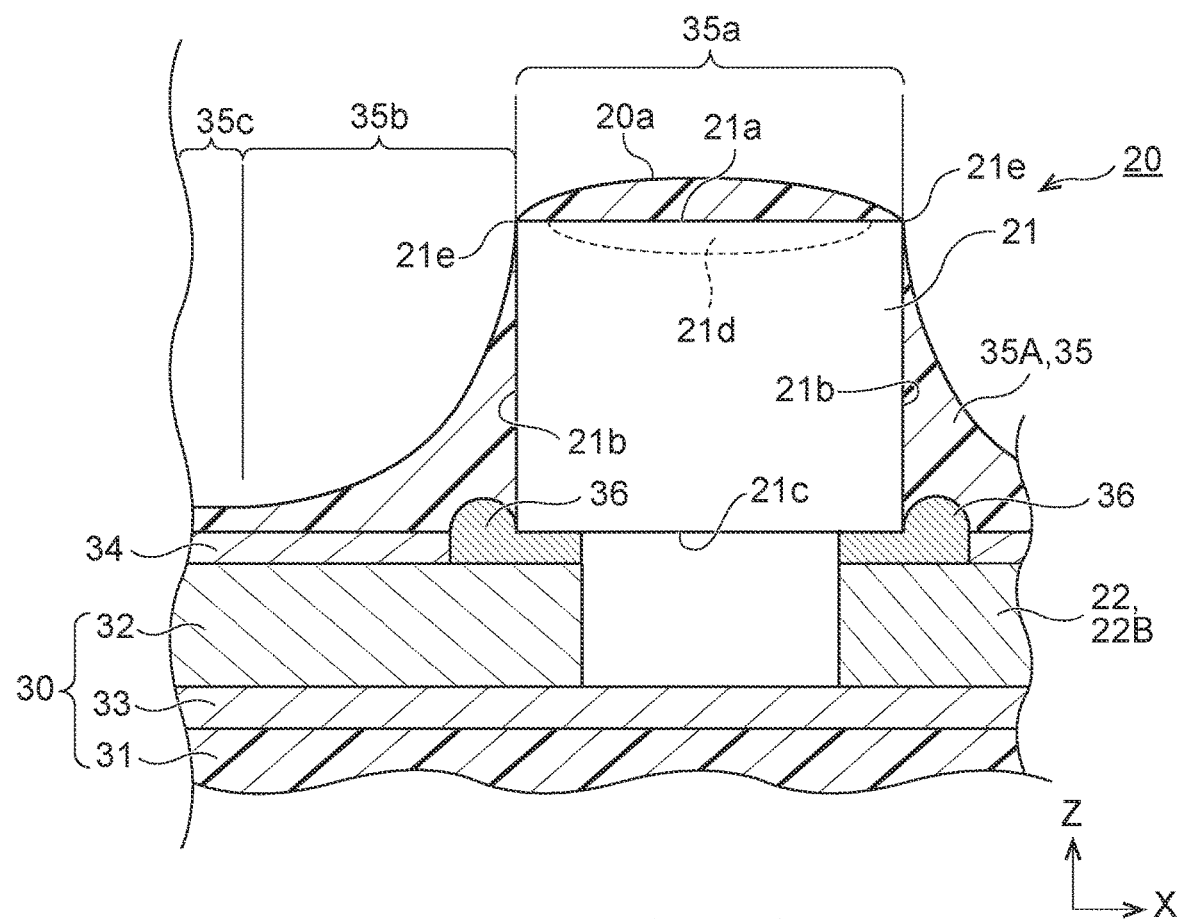
FIG. 16 is a sectional view showing a modification of the LED lighting sheet according to the third embodiment.

An example in which the transparent protective film 35 of the protective portion 35A covers the entire region of the front side 21a and side 21b of the LED chip 21 is described; however, the configuration is not limited thereto. For example, as shown in FIG. 16, parts around corners 21e of the LED chip 21 may be exposed. In this case, the usage of resin for forming the transparent protective film 35 is reduced. In this case as well, the above-described advantageous effects are obtained.

Figure 17:
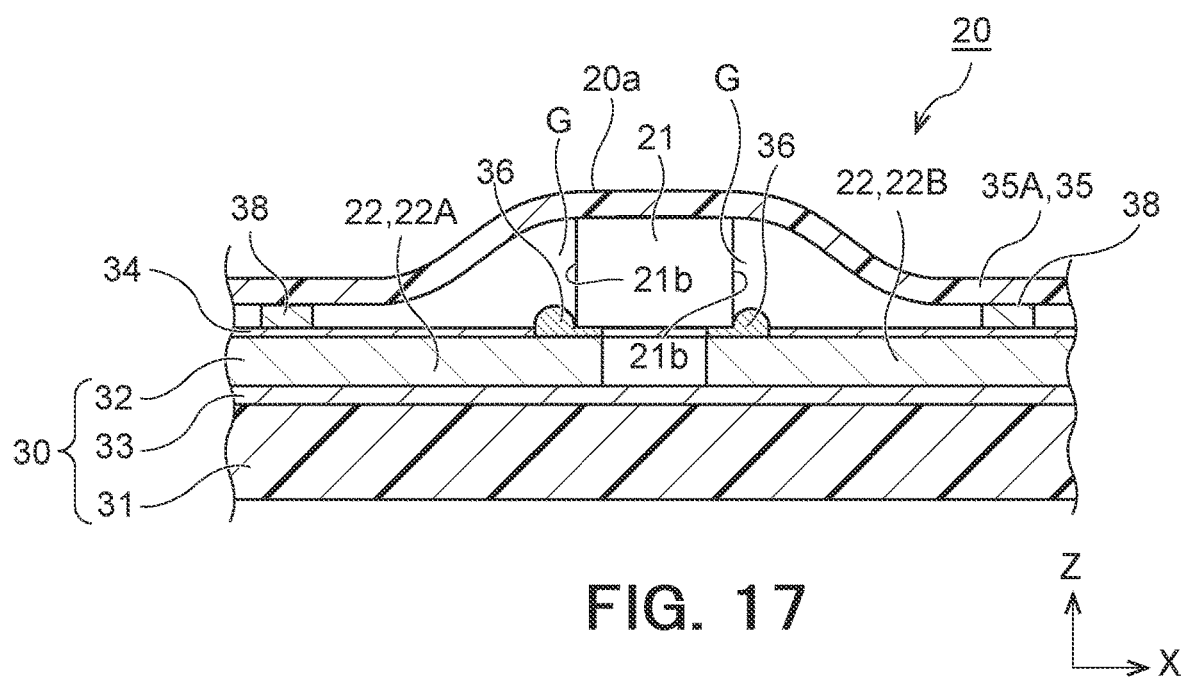
FIG. 17 is a sectional view showing a modification of the LED lighting sheet according to the third embodiment.

In the above-described present embodiment, an example in which the transparent protective film 35 is formed by spray coating or curtain coating is described; however, the configuration is not limited thereto. For example, the transparent protective film 35 may be formed by sticking a resin film to the LED chips 21 and the light reflection insulating protective film 34. In this case, a vinyl chloride resin, a fluororesin, or a general resin, such as polyethylene terephthalate (PET), polypropylene (PP), polyethylene (PE), polyethylene naphthalate (PEN), and polyimide (PI), may be used as the material of the resin film. In this way, when the transparent protective film 35 is made up of a resin film as well, the above-described advantageous effects are obtained. As shown in FIG. 17, the resin film may be bonded to the light reflection insulating protective film 34 via, for example, an adhesive 38. The resin film may be bonded to the light reflection insulating protective film 34 via, for example, a pressure-sensitive adhesive. Although not shown in the drawing, the resin film may be bonded to the light reflection insulating protective film 34 by, for example, a heat seal.

Figure 18:
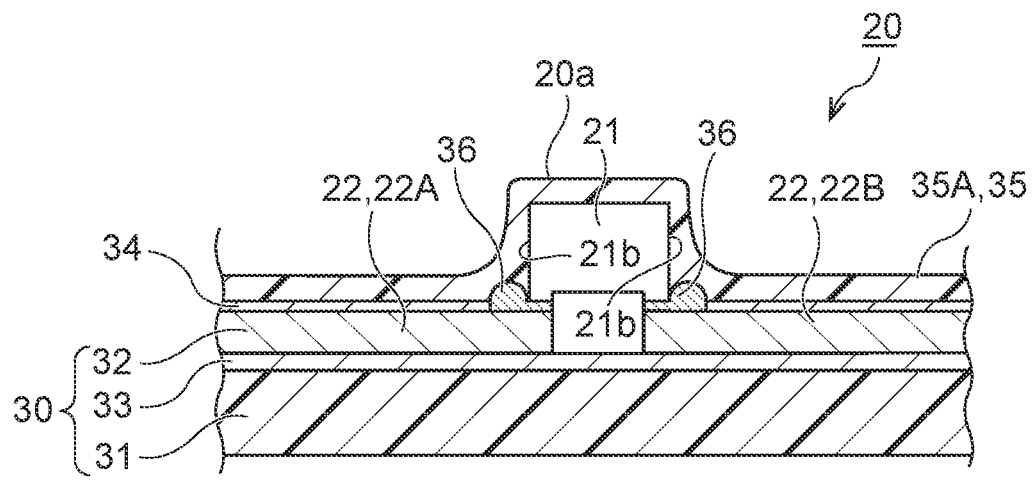
FIG. 18 is a sectional view showing a modification of the LED lighting sheet according to the third embodiment.

In this case, as shown in FIG. 17, a gap G may be formed between the side 21b of the LED chip 21 and the transparent protective film 35. When the gap G is formed between the side 21b of the LED chip 21 and the transparent protective film 35, a break of the transparent protective film 35 due to force applied to the LED chip 21 is reduced even when a worker touches the LED chip 21. As shown in FIG. 18, a gap does not need to be formed between the side 21b of the LED chip 21 and the transparent protective film 35. When no gap is formed between the side 21b of the LED chip 21 and the transparent protective film 35, the adhesion between the LED chip 21 and the transparent protective film 35 is improved, with the result that the LED chip 21 and the solder portion 36 are further effectively protected. In this case, the transparent protective film 35 may be bonded to the LED chips 21 and the light reflection insulating protective film 34 by, for example, vacuum lamination.

Figure 19:
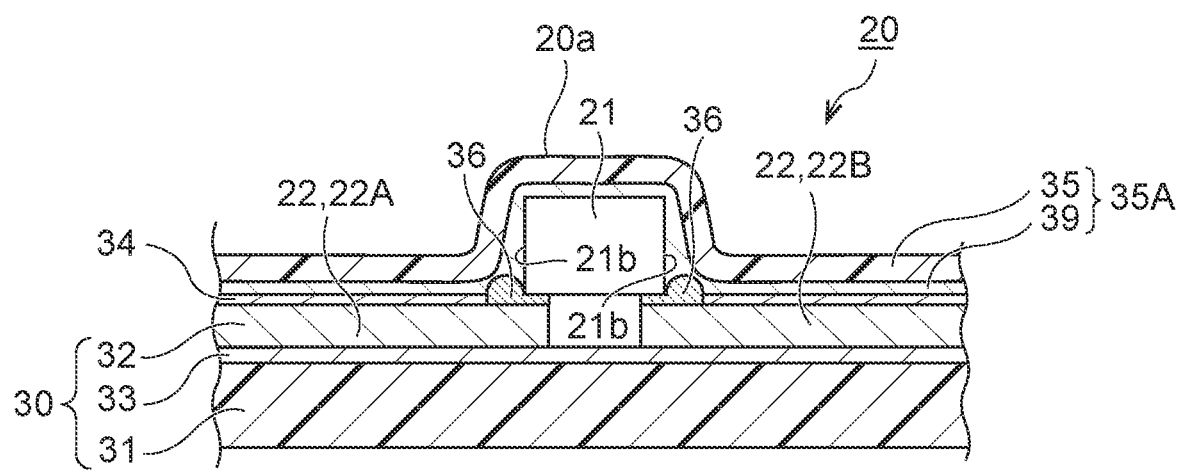
FIG. 19 is a sectional view showing a modification of the LED lighting sheet according to the third embodiment.

In the above-described present embodiment, an example in which the protective portion 35A includes only the transparent protective film 35 is described; however, the configuration is not limited thereto. For example, as shown in FIG. 19, the protective portion 35A may further include an adhesive layer (bonding layer) 39 that bonds the LED chip 21 and the transparent protective film 35. In this case, the adhesive layer 39 preferably has electrical insulation properties. With this configuration, such inconvenience that the fluorescent material 21*d* of the LED chip 21 does not light up due to a short-circuit between the adhesive layer 39 and the LED chip 21 is reduced. In the modification shown in FIG. 19, the transparent protective film 35 is bonded to the LED chip 21 via the adhesive layer 39. In this case as well, the above-described advantageous effects are obtained.

Figure 20:
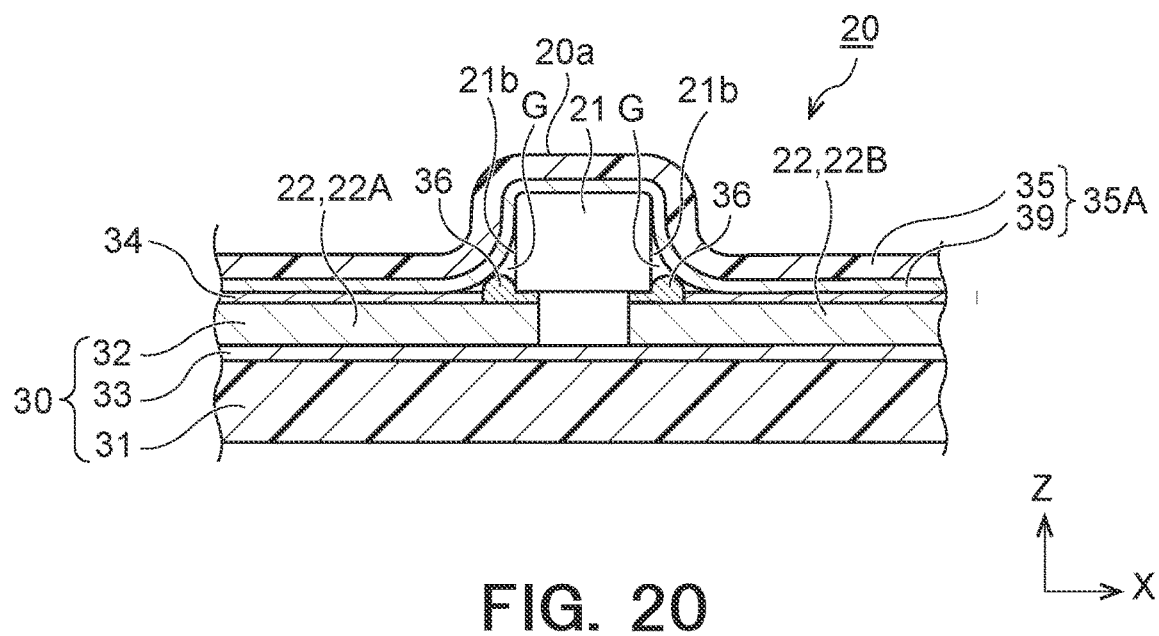
FIG. 20 is a sectional view showing a modification of the LED lighting sheet according to the third embodiment.

In this case, as shown in FIG. 19, a gap does not need to be formed between the side 21*b* of the LED chip 21 and the adhesive layer 39 of the protective portion 35A. When no gap is formed between the side 21*b* of the LED chip 21 and the adhesive layer 39, the adhesion between the LED chip 21 and the transparent protective film 35 is improved as in the case of the example shown in FIG. 18, with the result that the LED chip 21 and the solder portion 36 are further effectively protected. As shown in FIG. 20, a gap G may be formed between the side 21*b* of the LED chip 21 and the adhesive layer 39 of the protective portion 35A. When the gap G is formed between the side 21*b* of the LED chip 21 and the adhesive layer 39, a break of the transparent protective film 35 due to force applied to the LED chip 21 is reduced even when a worker touches the LED chip 21 as in the case of the example shown in FIG. 17.

Figure 21:
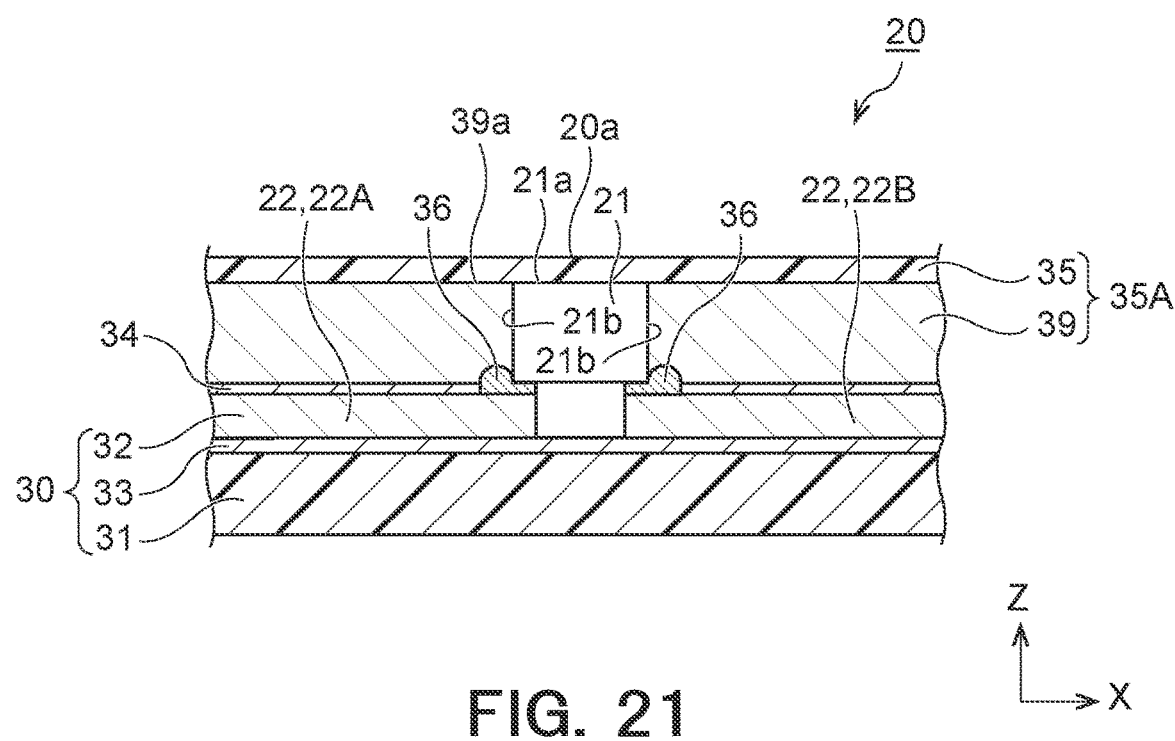
FIG. 21 is a sectional view showing a modification of the LED lighting sheet according to the third embodiment.

As shown in FIG. 21, the adhesive layer 39 may cover the side 21*b* of the LED chip 21. In this case, as shown in FIG. 21, the front side 21*a* of the LED chip 21 and the front side 39*a* of the adhesive layer 39 may be flush with each other or, although not shown in the drawing, the adhesive layer 39 may be interposed between the front side 21*a* of the LED chip 21 and the transparent protective film 35. In these cases, the overall front side (light emitting surface 20*a*) of the LED lighting sheet 20 becomes smooth. With this configuration, the shock-absorbing characteristics of the LED lighting sheet 20 against impact from the outside are improved. In these cases as well, the above-described advantageous effects are obtained.

Figure 22:
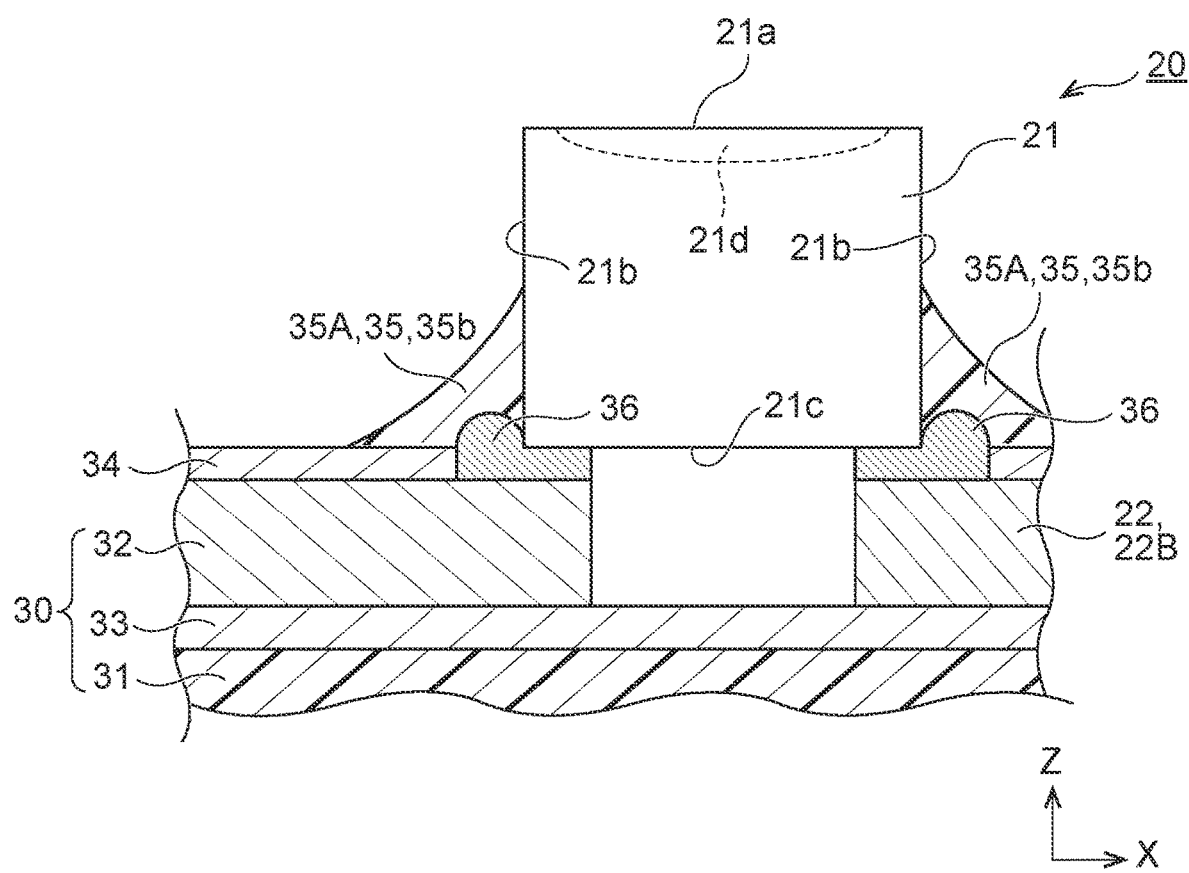
FIG. 22 is a sectional view showing a modification of the LED lighting sheet according to the third embodiment.

In the above-described present embodiment, an example in which the protective portion 35A covers only the front side 21*a* of the LED chip 21 is described; however, the configuration is not limited thereto. For example, as shown in FIG. 22, the protective portion 35A does not need to cover the front side 21*a* of the LED chip 21. In this case, the protective portion 35A does not need to partially cover the light reflection insulating protective film 34. In other words, the transparent protective film 35 of the protective portion 35A does not need to include the center part 35*a* or the flat part 35*c*. The curved part 35*b* of the transparent protective film 35 may be configured not to cover the entire region of the side 21*b* of the LED chip 21 but to cover at least the solder portion 36 located laterally to the LED chip 21. In this case as well, the curved part 35*b* of the transparent protective film 35 covers the solder portion 36 located laterally to the LED chip 21, so the above-described advantageous effects are obtained.

The plurality of component elements described in the embodiments and the modifications may be combined as needed. Alternatively, some component elements may be deleted from all the component elements described in the embodiments and the modifications.

The invention claimed is:

1. An LED lighting unit for animal/plant growth, comprising:
    a substrate film,
    a metal wiring portion formed on a surface of the substrate film,
    an array of LED chips implemented on the metal wiring portion, and
    a light reflection insulating protective film placed so as to cover the metal wiring portion, wherein
    a light source color of each of the LED chips is an incandescent or a warm white, of light source colors defined in JISZ9112,
    light from the LED chips has
        a first component with a center wavelength of greater than or equal to 610 nm and less than or equal to 630 nm and a half width of greater than or equal to 90 nm and less than or equal to 110 nm,
        a second component with a center wavelength of greater than or equal to 440 nm and less than or equal to 460 nm and a half width of greater than or equal to 10 nm and less than or equal to 20 nm, and
        a third component with a center wavelength of greater than or equal to 510 nm and less than or equal to 530 nm and a half width of greater than or equal to 50 nm and less than or equal to 60 nm,
    a relative emission intensity in the center wavelength of the first component is higher than a relative emission intensity in the center wavelength of the second component,
    a relative emission intensity in the center wavelength of the third component is lower than the relative emission intensity in the center wavelength of the second component,
    the light reflection insulating protective film includes a white pigment,
    the light reflection insulating protective film includes a urethane resin, an acrylic polyurethane resin or a phenolic resin,
    the LED chips are covered with a transparent protective film, and
    the transparent protective film includes an acrylic polyurethane or a fluororesin.

2. The LED lighting unit for animal/plant growth according to claim 1, wherein the light source color of each of the LED chips is the incandescent.

3. The LED lighting unit for animal/plant growth according to claim 1, wherein ten or more of the LED chips are arranged in series, and four or more rows of the LED chips arranged in series are arranged in parallel.

4. The LED lighting unit for animal/plant growth according to claim 1, wherein in the LED lighting unit for animal/plant growth, a thickest part thereof is a part on which the LED chips are arranged, and a thickness of the thickest part is less than or equal to 5 mm.

5. An LED lighting module for animal/plant growth, comprising:
    the LED lighting unit for animal/plant growth according to claim 1; and
    a controller electrically connected to the LED lighting unit for animal/plant growth, wherein
    the controller is externally connected to the LED lighting unit for animal/plant growth.

6. The LED lighting module for animal/plant growth according to claim 5, wherein a constant voltage is applied from the controller to the LED lighting unit for animal/plant growth.

7. The LED lighting module for animal/plant growth according to claim 5, wherein the controller is capable of controlling lighting of the LED chips.

8. A shelf for an animal/plant growth rack, comprising:
a board; and
the LED lighting unit for animal/plant growth according to claim 1, attached to the board.

9. An animal/plant growth rack comprising
a shelf, wherein
the shelf includes the LED lighting unit for animal/plant growth according to claim 1, attached to a lower side of a board.

10. The animal/plant growth rack according to claim 9, wherein the LED lighting unit for animal/plant growth is further placed to a side of the shelf.

11. An animal/plant growth factory comprising:
a building; and
the animal/plant growth rack according to claim 9, placed in the building.

12. An LED lighting unit for animal/plant growth, comprising:
a substrate film,
a metal wiring portion formed on a surface of the substrate film,
an array of LED chips implemented on the metal wiring portion, and
a light reflection insulating protective film placed so as to cover the metal wiring portion, wherein
an emission spectrum of light from the LED chips has
a first peak with a center wavelength of greater than or equal to 610 nm and less than or equal to 630 nm,
a second peak with a center wavelength of greater than or equal to 440 nm and less than or equal to 460 nm, and
a third peak with a center wavelength of greater than or equal to 510 nm and less than or equal to 530 nm,
a relative emission intensity in the first peak is higher than a relative emission intensity in the second peak, and
a relative emission intensity in the third peak is lower than the relative emission intensity in the second peak,
light from the LED chips has
a first component with a center wavelength of greater than or equal to 610 nm and less than or equal to 630 nm and a half width of greater than or equal to 90 nm and less than or equal to 110 nm,
a second component with a center wavelength of greater than or equal to 440 nm and less than or equal to 460 nm and a half width of greater than or equal to 10 nm and less than or equal to 20 nm, and
a third component with a center wavelength of greater than or equal to 510 nm and less than or equal to 530 nm and a half width of greater than or equal to 50 nm and less than or equal to 60 nm,
a relative emission intensity in the center wavelength of the first component is higher than a relative emission intensity in the center wavelength of the second component,
a relative emission intensity in the center wavelength of the third component is lower than the relative emission intensity in the center wavelength of the second component,
the light reflection insulating protective film includes a white pigment,
the light reflection insulating protective film includes a urethane resin, an acrylic polyurethane resin or a phenolic resin,
the LED chips are covered with a transparent protective film, and
the transparent protective film includes an acrylic polyurethane or a fluororesin.

13. The LED lighting unit for animal/plant growth according to claim 12, wherein
the relative emission intensity in the center wavelength of the second component is higher than or equal to 0.5 times and lower than or equal to 0.7 times the relative emission intensity in the center wavelength of the first component, and
the relative emission intensity in the center wavelength of the third component is higher than or equal to 0.3 times and lower than or equal to 0.5 times the relative emission intensity in the center wavelength of the first component.

14. An LED lighting unit for animal/plant growth, comprising:
a substrate film,
a metal wiring portion formed on a surface of the substrate film,
an array of LED chips implemented on the metal wiring portion, and
a light reflection insulating protective film placed so as to cover the metal wiring portion, wherein
a chromaticity of light from the LED chips falls within a rectangular region connecting four sets of chromaticity coordinates (0.39, 0.36), (0.41, 0.44), (0.46, 0.44), and (0.42, 0.36) in an xy chromaticity diagram,
light from the LED chips has
a first component with a center wavelength of greater than or equal to 610 nm and less than or equal to 630 nm and a half width of greater than or equal to 90 nm and less than or equal to 110 nm,
a second component with a center wavelength of greater than or equal to 440 nm and less than or equal to 460 nm and a half width of greater than or equal to 10 nm and less than or equal to 20 nm, and
a third component with a center wavelength of greater than or equal to 510 nm and less than or equal to 530 nm and a half width of greater than or equal to 50 nm and less than or equal to 60 nm,
a relative emission intensity in the center wavelength of the first component is higher than a relative emission intensity in the center wavelength of the second component,
a relative emission intensity in the center wavelength of the third component is lower than the relative emission intensity in the center wavelength of the second component,
the light reflection insulating protective film includes a white pigment,
the light reflection insulating protective film includes a urethane resin, an acrylic polyurethane resin or a phenolic resin,
the LED chips are covered with a transparent protective film, and
the transparent protective film includes an acrylic polyurethane or a fluororesin.

* * * * *